United States Patent
Kellam et al.

(10) Patent No.: US 8,716,780 B2
(45) Date of Patent: May 6, 2014

(54) THREE-DIMENSIONAL MEMORY ARRAY STACKING STRUCTURE

(75) Inventors: Mark D. Kellam, Siler City, NC (US); Gary B. Bronner, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/505,442

(22) PCT Filed: Aug. 26, 2010

(86) PCT No.: PCT/US2010/046831
§ 371 (c)(1), (2), (4) Date: May 1, 2012

(87) PCT Pub. No.: WO2011/056281
PCT Pub. Date: May 12, 2011

(65) Prior Publication Data
US 2012/0211722 A1    Aug. 23, 2012

Related U.S. Application Data

(60) Provisional application No. 61/259,070, filed on Nov. 6, 2009.

(51) Int. Cl.
| | | |
|---|---|---|
| H01L 29/76 | (2006.01) | |
| H01L 29/788 | (2006.01) | |
| H01L 29/66 | (2006.01) | |
| H01L 29/06 | (2006.01) | |
| H01L 47/00 | (2006.01) | |

(52) U.S. Cl.
USPC ............ 257/314; 257/4; 257/5; 257/315; 257/316; 257/317; 257/318; 257/319; 257/320; 257/321; 257/322; 257/323; 257/E21.614; 257/E27.026; 257/E27.027

(58) Field of Classification Search
USPC .......... 257/4, 5, E21.614, E27.026, E27.027, 257/314–323
See application file for complete search history.

(56) References Cited

U.S. PATENT DOCUMENTS

| | | | |
|---|---|---|---|
| 6,034,882 A | 3/2000 | Johnson et al. | 365/103 |
| 6,933,556 B2 * | 8/2005 | Endoh et al. | 257/315 |
| 7,112,815 B2 * | 9/2006 | Prall | 257/2 |
| 7,576,384 B2 * | 8/2009 | Gidon | 257/316 |
| 7,943,923 B2 * | 5/2011 | Gidon | 257/5 |
| 7,948,024 B2 * | 5/2011 | Kim et al. | 257/318 |
| 8,173,987 B2 * | 5/2012 | Lung | 257/2 |
| 8,314,455 B2 * | 11/2012 | Shiino et al. | 257/324 |
| 8,338,876 B2 * | 12/2012 | Kito et al. | 257/315 |
| 8,450,788 B2 * | 5/2013 | Shim et al. | 257/314 |
| 8,461,643 B2 * | 6/2013 | Lee | 257/326 |

(Continued)

OTHER PUBLICATIONS

Rambus Inc., International Search Report and Written Opinion, PCT/US2010/046831, Apr. 4, 2011, 7 pages.

*Primary Examiner* — Ida M Soward

(74) *Attorney, Agent, or Firm* — Morgan, Lewis & Bockius LLP

(57) ABSTRACT

A memory device includes a planar substrate, a plurality of horizontal conductive planes above the planar substrate, and a plurality of horizontal insulating layers interleaved with the plurality of horizontal conductive planes. An array of vertical conductive columns, perpendicular to the pluralities of conductive planes and insulating layers, passes through apertures in the pluralities of conductive planes and insulating layers. The memory device includes a plurality of programmable memory elements, each of which couples one of the horizontal conductive planes to a respective vertical conductive column.

34 Claims, 28 Drawing Sheets

(56) References Cited

U.S. PATENT DOCUMENTS

| | | | |
|---|---|---|---|
| 8,546,861 B2 * | 10/2013 | Hwang | 257/298 |
| 2006/0033182 A1 | 2/2006 | Hsu | |
| 2007/0132049 A1 | 6/2007 | Stipe | |
| 2008/0175031 A1 | 7/2008 | Park et al. | |
| 2009/0122598 A1 | 5/2009 | Toda et al. | |
| 2009/0237978 A1 | 9/2009 | Lee et al. | |
| 2009/0310425 A1 * | 12/2009 | Sim et al. | 365/185.29 |
| 2010/0078622 A1 * | 4/2010 | Yoshimizu et al. | 257/4 |
| 2010/0140682 A1 * | 6/2010 | Kamioka et al. | 257/319 |
| 2011/0101298 A1 * | 5/2011 | Tang et al. | 257/5 |
| 2011/0140070 A1 * | 6/2011 | Kim | 257/5 |

* cited by examiner

THREE-DIMENSIONAL MEMORY ARRAY STACKING STRUCTURE

CROSS REFERENCE TO RELATED APPLICATIONS

This Application is a United States National Stage Application filed under 35 U.S.C. §371 of PCT Patent Application Serial No. PCT/US2010/046831 filed on Aug. 26, 2010, which claims the benefit of and priority to U.S. Provisional Patent Application Ser. No. 61/259,070 filed on Nov. 6, 2009, both of which are hereby incorporated by reference in their entireties.

TECHNICAL FIELD

The disclosed embodiments relate generally to memory devices, and more particularly, to three-dimensional memory architectures.

BACKGROUND

The design and fabrication of three-dimensional memory arrays present significant engineering challenges. For example, architectures for three-dimensional resistance-switching random access memory (RRAM) may require numerous photolithographic processing steps to fabricate the memory array, resulting in a complicated manufacturing process with a high cost per bit. High parasitic wiring resistance also presents challenges in traditional architectures for three-dimensional RRAMs. Accordingly, there is a need for improved three-dimensional memory (e.g., RRAM) architectures.

BRIEF DESCRIPTION OF THE DRAWINGS

Like reference numerals refer to corresponding parts throughout the drawings.

DESCRIPTION OF EMBODIMENTS

Figure 1:
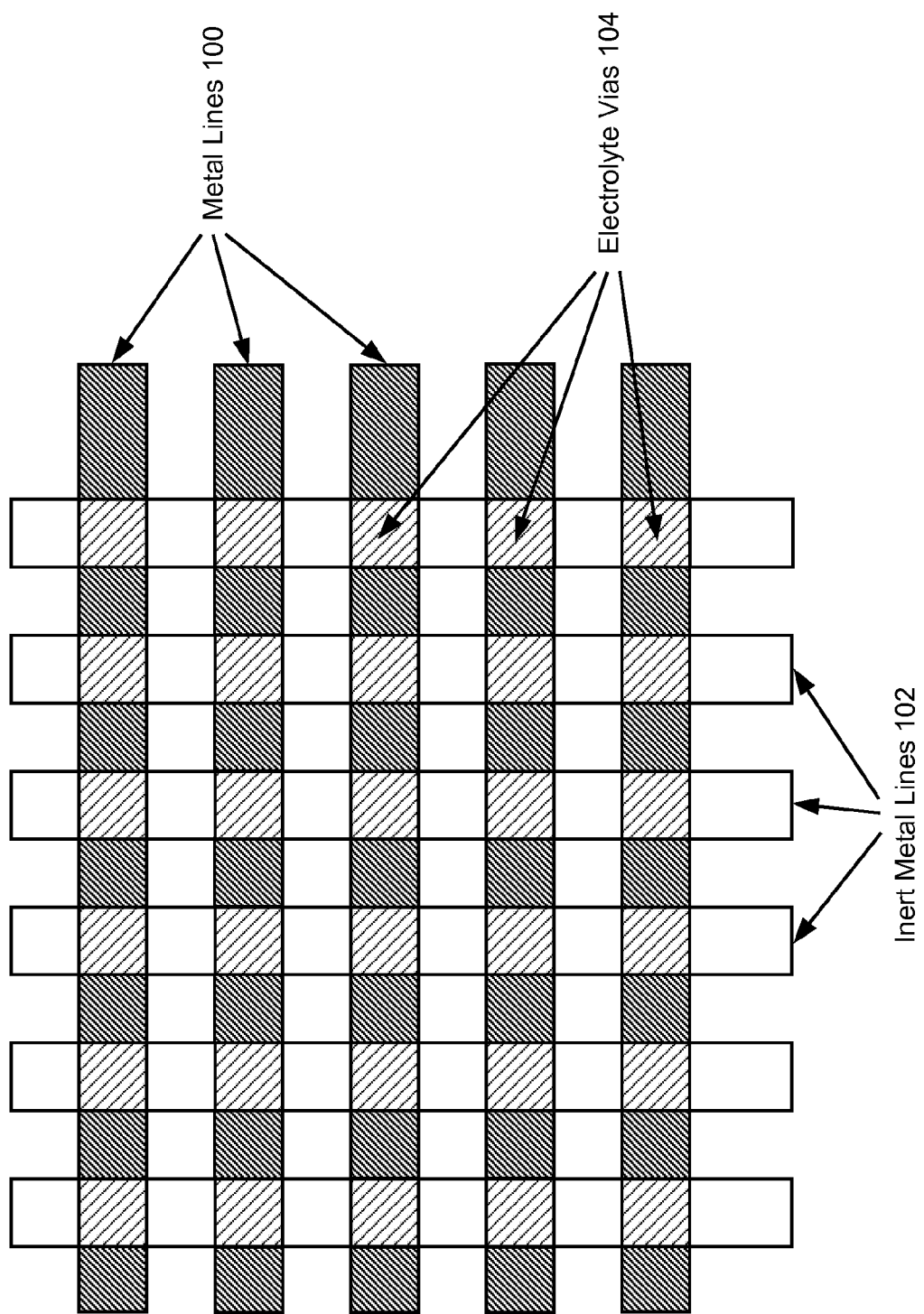
FIG. 1 shows a plan view of programmable memory elements and associated metal lines in a stacked cross-point array architecture.

A memory device has a three-dimensional array stacking structure. The structure includes a planar substrate, a plurality of horizontal conductive planes above the planar substrate, and a plurality of horizontal insulating layers interleaved with the plurality of horizontal conductive planes. Vertical conductive columns, perpendicular to the conductive planes and insulating layers, pass through apertures in the conductive planes and insulating layers. Finally, each memory element of the memory device couples one of the horizontal conductive planes to a respective vertical conductive column.

To program or store information in this memory device, a horizontal conductive plane and a vertical conductive column are selected, and then a voltage is applied between the selected horizontal conductive plane and the selected vertical conductive column to program the programmable memory element that couples the selected horizontal conductive plane to the selected vertical conductive column.

To read information from this memory device, a horizontal conductive plane and a vertical conductive column are selected. Then, a current or voltage corresponding to a resistance between the selected horizontal conductive plane and a signal line coupled to the selected vertical conductive column is compared with a reference to determine what information is stored in the memory element coupling the selected horizontal conductive plane to the selected vertical conductive column.

A memory cell, such as a memory cell in the three-dimensional array stacking structure or other memory array, includes resistance-switching material and also includes an isolation device having bidirectional conductivity above a threshold voltage, in series with the resistance-switching material.

Reference will now be made in detail to embodiments, examples of which are illustrated in the accompanying drawings. However, it will be apparent to one of ordinary skill in the art that some embodiments may be practiced without these specific details. Furthermore, in the follow description, well-known methods, procedures, components, and circuits have not been described in detail so as not to unnecessarily obscure aspects of the embodiments.

Various types of nonvolatile memories use memory elements (i.e., memory cells) that are formed from materials that can change states, such that different states are associated with different data values. The memory elements are programmed by inducing state changes corresponding to the data values to be programmed and are read by measuring a physical parameter that varies between states. For example, memory cells in RRAMs are formed using resistance-switching memory elements. While many of the embodiments discussed herein are presented in the context of RRAM, other embodiments may be implemented using other types of memories with memory elements that change states.

The memory elements in RRAMs include a resistance-switching material situated between two electrodes. The resistance-switching material has two states, a high-resistance state and a low-resistance state, and can be cycled between these two states by application of appropriate voltages to the electrodes, thus allowing the memory elements to be programmed. The term "RRAM" as used herein includes any memory with memory elements that include resistance-switching material that can be cycled between high- and low-resistance states. Four general classes of resistance-switching materials are phase-change materials, insulating materials, solid electrolyte materials, and organic materials. The term "RRAM" as used herein thus includes, without limitation, memories that use any of these classes of resistance-switching materials (e.g., phase-change memories). Examples of resistance-switching insulating materials include $TiO_2$, $NiO$, $SrZrO_3$, $SrTiO_3$, $ZrO_2$, $MO$, $MgO$, $WO_3$, and $HfO_2$. Examples of resistance-switching electrolyte materials include $Ge_xSe_{1-x}$, $Ge_xS_{1-x}$, $Cu_2S$, $CuO$, $Ag_2S$, and $SiO_2$.

A programmable memory element using a solid electrolyte material as the resistance-switching material is typically fabricated using a metal that exhibits ionic conductivity in the solid electrolyte (i.e., a metal ion source for the solid electrolyte) as the first electrode and an inert metal as the second electrode. Application of an appropriate first voltage causes the first electrode to inject ions into the solid electrolyte; the ions precipitate into filaments that produce low-resistance paths between the electrodes, resulting in formation of a low-resistance state (e.g., an "on" state) in the solid electrolyte. Application of an appropriate second voltage, distinct from the first voltage, causes the dissolution of the filaments, resulting in formation of a high-resistance state (e.g., an "off" state) in the solid electrolyte. While other types of resistance-switching materials may operate in accordance with other physical mechanisms, the materials also may be programmed to low-resistance and high-resistance (e.g., on and off) states.

FIG. 1 shows a plan view of programmable memory elements and associated metal lines in a stacked cross-point array architecture. Parallel lines 102 of an inert metal are fabricated in a first layer. Parallel lines 100 of a metal that serves as a metal ion source for a solid electrolyte are fabricated in a second layer. The second layer is separated from the first layer by a dielectric layer (e.g., an inter-layer dielectric (ILD)) and the parallel lines 100 are formed at right angles to the parallel lines 102. At each point where a line 102 crosses a line 100, vias 104 filled with resistance-switching material connect the two lines. Each via 104, along with the metal above and below it in the lines 100 and 102, constitutes a memory cell: the lines 102 serve as inert electrodes and the lines 100 serve as metal ion sources. By repeatedly stacking layers of lines 100 and layers of lines 102 on top of each other and coupling the lines with vias 104 as shown in FIG. 1, a three-dimensional memory array is produced.

Each layer of the memory array of FIG. 1 could be fabricated using at least two high-resolution photolithographic steps: one to pattern the vias and one to pattern the metal lines 100 or 102. An N layer stack thus would be fabricated using at least 2N+1 photolithographic masking steps that must be properly aligned. The narrow metal lines 100 or 102 also suffer from high resistance, causing memory cells to have high parasitic resistance depending on their positions in the array.

Figure 2:
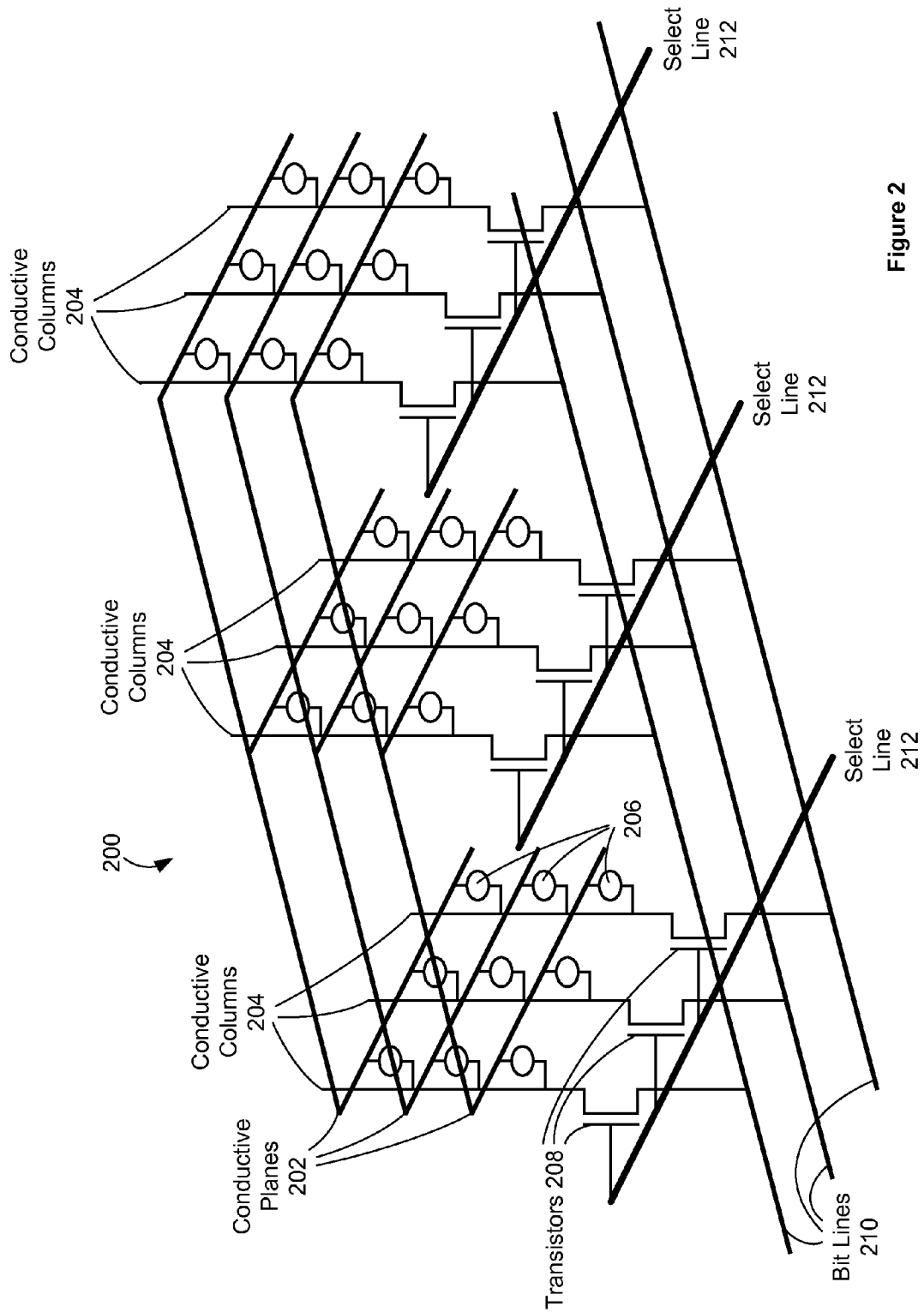
FIG. 2 illustrates a schematic diagram of a three-dimensional memory architecture with a stack of horizontal conductive planes in accordance with some embodiments.

The problems associated with the memory array of FIG. 1 can be mitigated with an alternative memory architecture using a stack of horizontal conductive planes interleaved with insulating layers. FIG. 2 illustrates a schematic diagram of a three-dimensional memory architecture 200 with a stack of horizontal conductive planes 202 in accordance with some embodiments. While three conductive planes 202 are shown in FIG. 2 for visual simplicity, in some embodiments a device with the architecture 200 includes at least 2 horizontal conductive planes 202, or at least 16 horizontal conductive planes 202, or 128 or more horizontal conductive planes 202. The architecture 200 also includes an array of vertical conductive columns 204 that are perpendicular to the horizontal conductive planes 202. A plurality of programmable memory elements 206 are arranged in a three-dimensional array. Each programmable memory element 206 couples a horizontal conductive plane 202 to a vertical conductive column 204. Transistors 208 selectively couple vertical conductive columns 204 to bit lines 210, which are coupled in turn to read and write circuitry (not shown). As FIG. 2 shows, a row (or column) of vertical conductive columns 204 are selectively coupled to a respective bit line 210. Select lines 212 are coupled to the gates of transistors 208 to enable the transistors 208 to selectively couple the vertical conductive columns 204 to the bit lines 210. As FIG. 2 shows, a column (or row) of transistors 208 are coupled to a respective select line 212.

FIGS. 3A-3H and 4A-4H illustrate various stages of fabrication of a three-dimensional memory architecture such as the architecture 200 in accordance with some embodiments. FIGS. 3A-3H illustrate fabrication of bit lines 210 (FIG. 2) and transistors 208 (FIG. 2) in accordance with some embodiments.

Figure 3A:
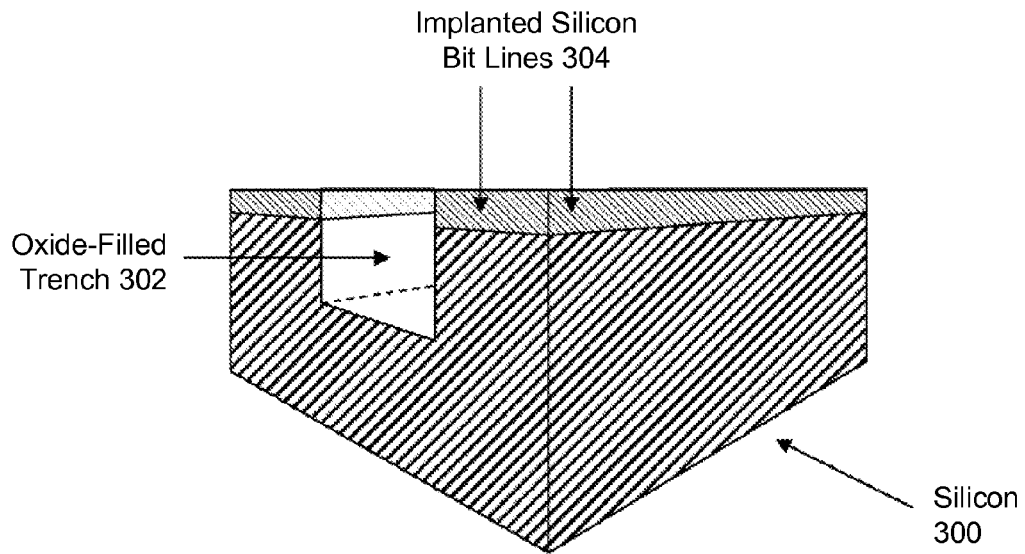
FIGS. 3A-3H illustrate various stages of fabrication of a three-dimensional memory array in accordance with some embodiments.

In FIG. 3A, a top layer of the silicon 300 is implanted, making it conductive. A trench 302 is etched into the silicon 300. The trench 302 is filled with oxide by depositing oxide on the silicon 300 using standard techniques and then performing chemical-mechanical polishing (CMP) to remove all oxide that is above or outside the trench 302. In some embodiments, a set of parallel trenches 302 (not shown) is formed in the silicon 300 and filled with oxide, as just described. As a result, conductive bit lines 304 are fabricated. The conductive bit lines 304 will function as the bit lines 210 (FIG. 2) in accordance with some embodiments.

Figure 3B:
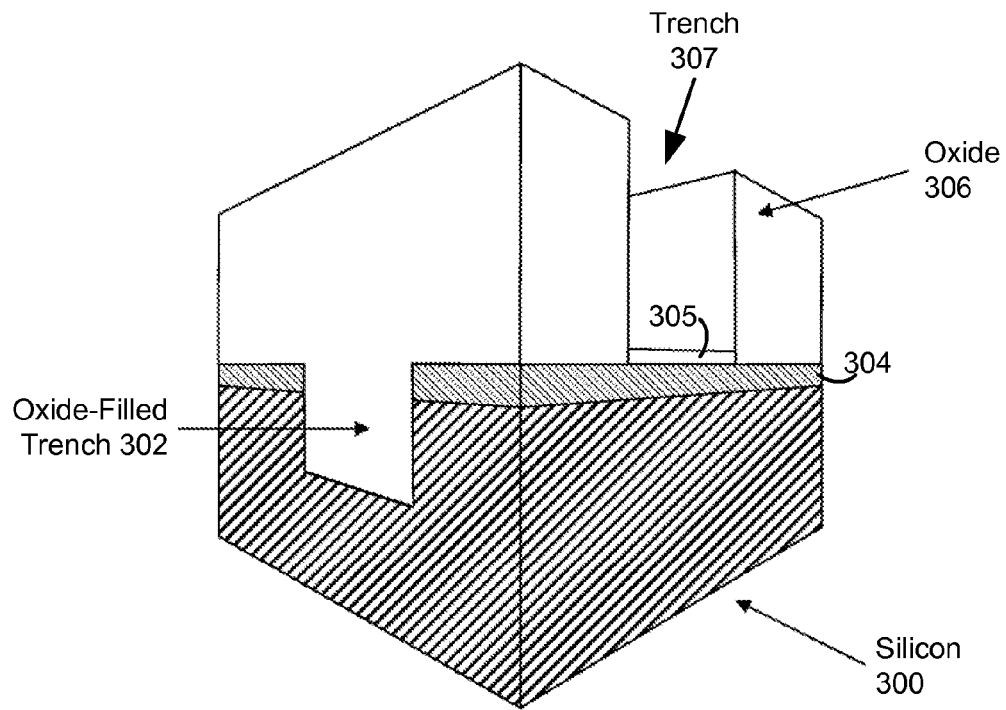

In FIG. 3B, an oxide layer 306 is deposited on the bit lines 304 and oxide-filled trench 302 and a trench 307 is etched in the oxide layer 306. The trench 307 provides an opening in which a vertical transistor will be fabricated, with the portion of the bit line 304 beneath the trench 307 to function as the source of the vertical transistor. An oxide layer 305 (e.g., a thermal oxide) is grown in the trench 307.

Figure 3C:
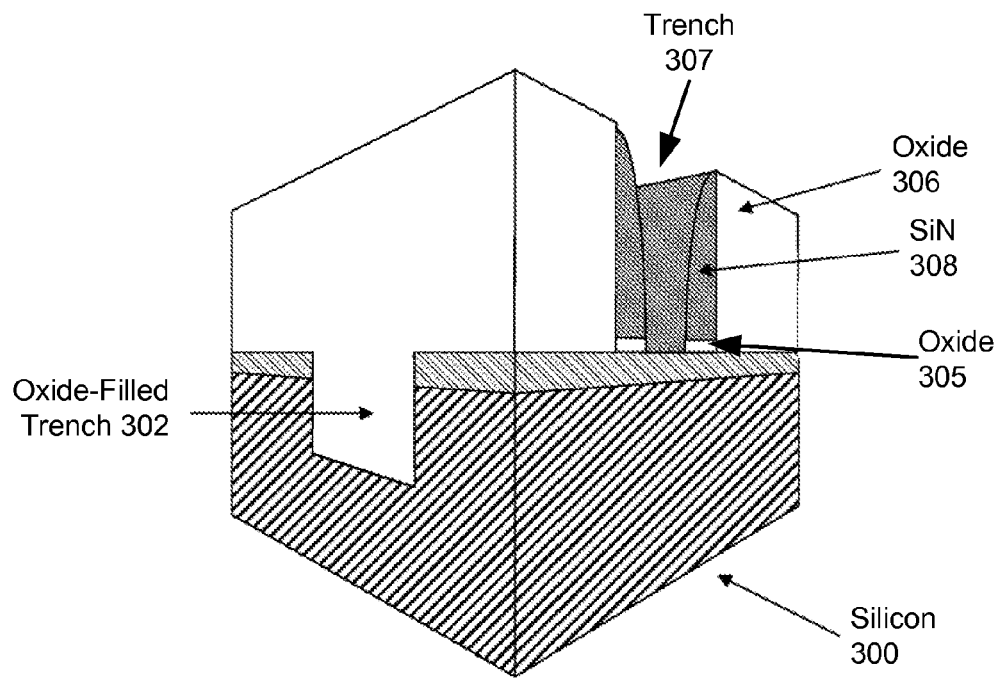
Figure 3D:
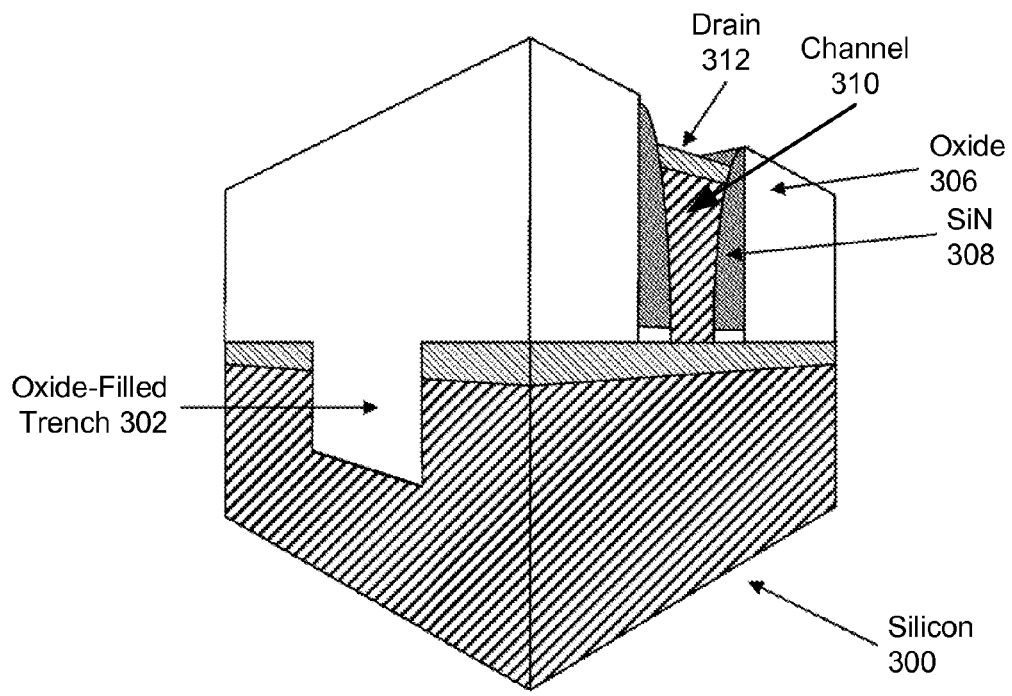
Figure 3E:
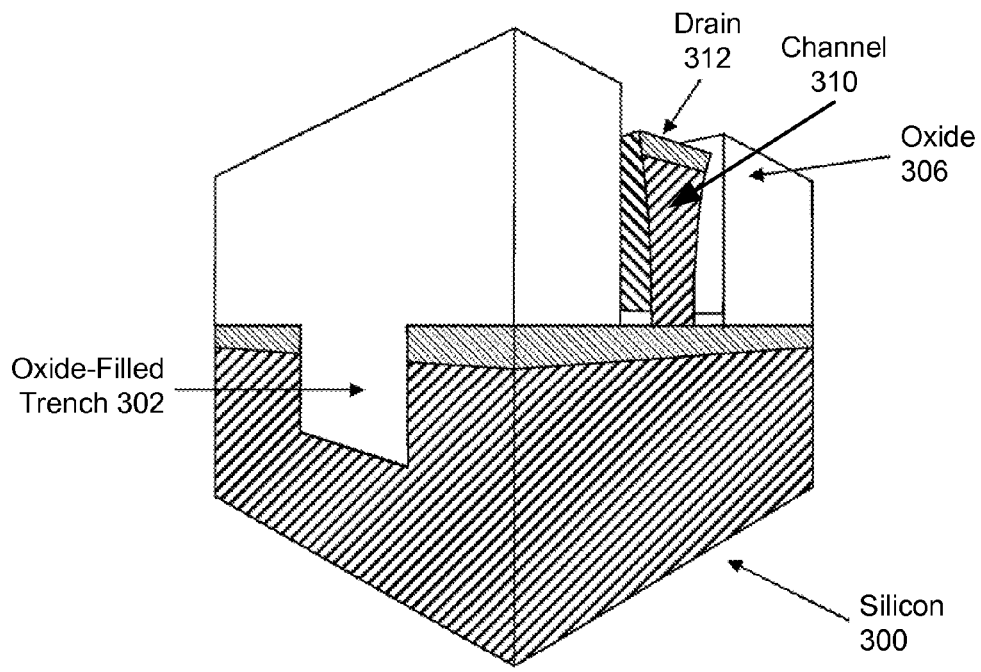

In FIG. 3C, silicon nitride (SiN) spacers ("nitride spacers") 308 are formed on the sides of the trench 307, above the oxide layer 305 (FIG. 3B), and the portion of the oxide layer 305 not covered by the nitride spacers 308 is etched away. In FIG. 3D, silicon is grown (e.g., using selective epitaxial growth) in the space between the nitride spacers 308. A top layer of the silicon is implanted, resulting in formation of a drain 312 with a channel 310 beneath it. In FIG. 3E, the nitride spacers 308 are removed using an appropriate etch (e.g., a wet or dry etch). The space previously occupied by the nitride spacers 308 will be used to fabricate a gate for the vertical transistor.

Figure 3F:
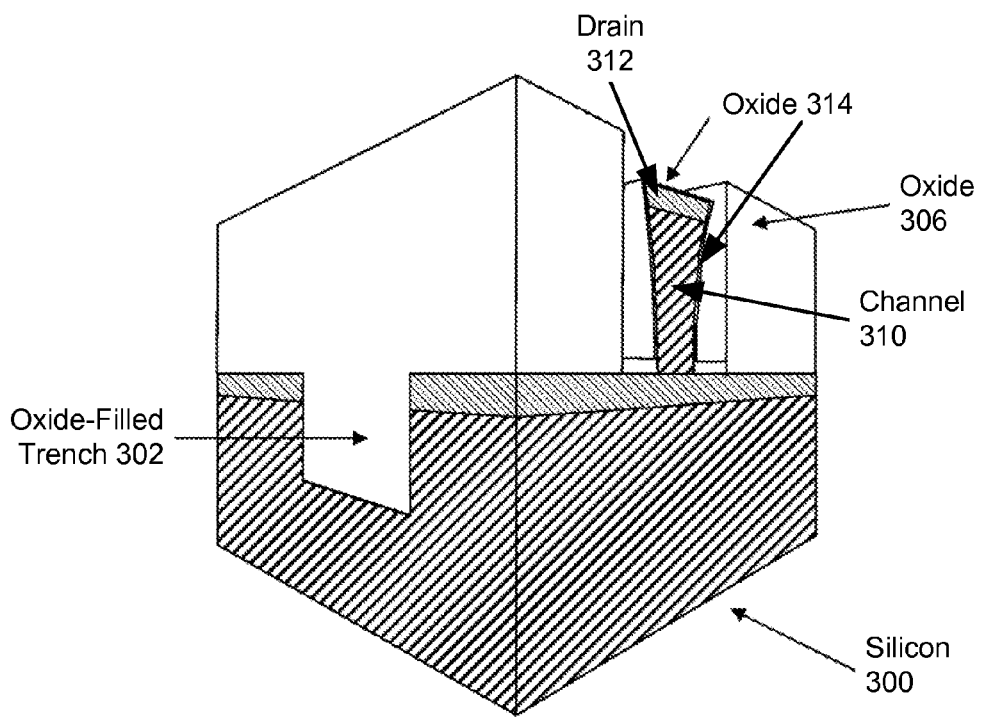

In FIG. 3F, a gate insulator 314 is formed on the top and sides of the drain 312 and channel 310. For example, a thermal oxide 314 is grown on the top and sides of the drain 312 and channel 310. The portion of the thermal oxide 314 on the sides of the channel 310 will function as a gate insulator.

Figure 3G:
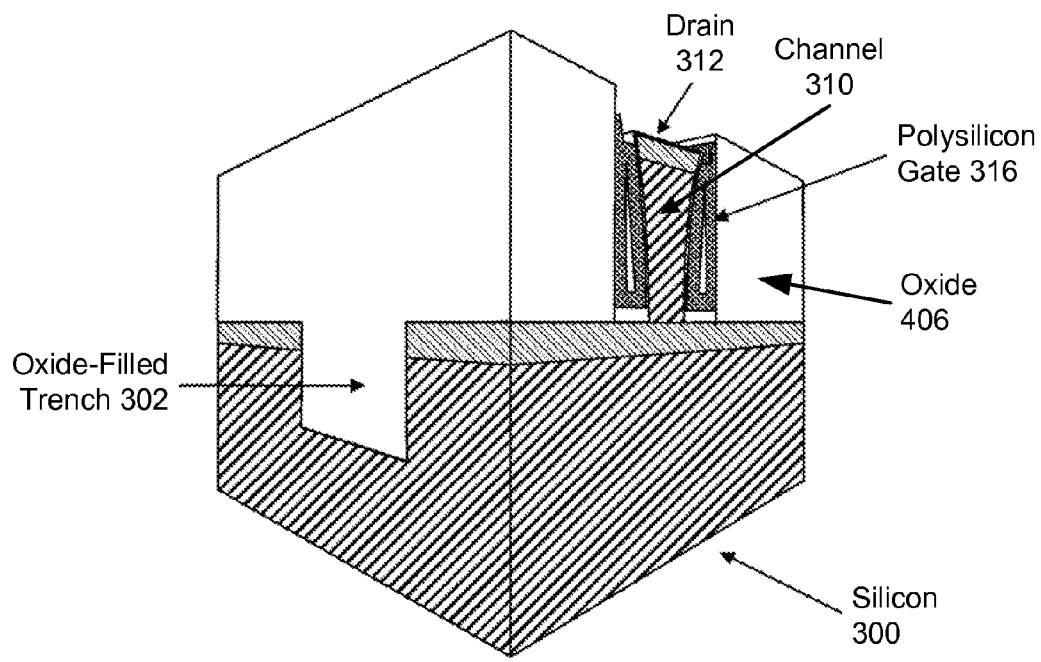
Figure 3H:
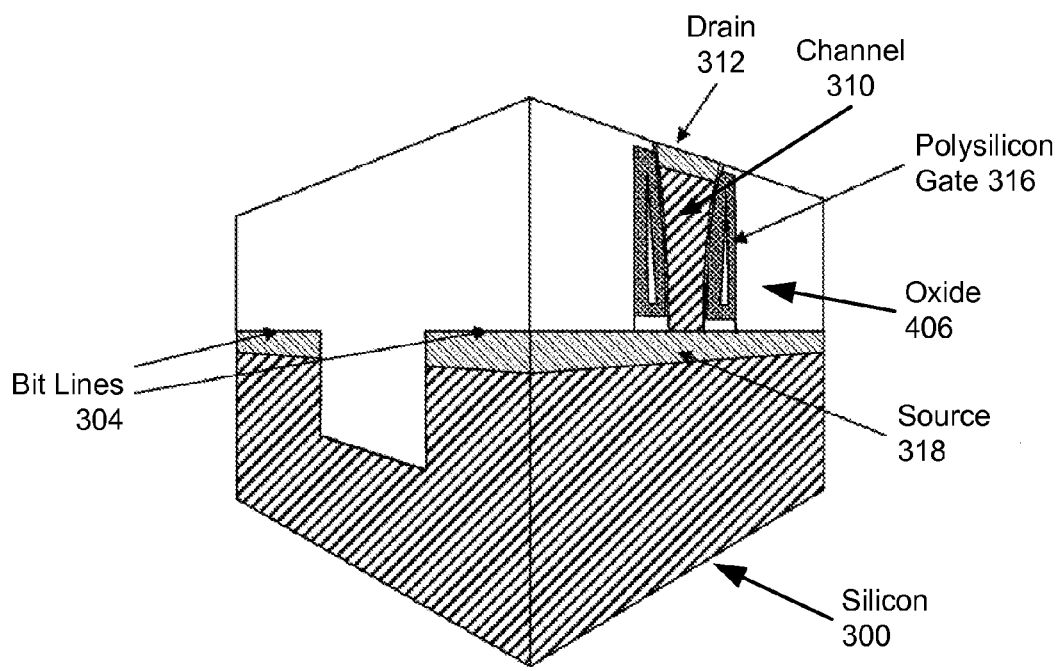

Doped polysilicon is deposited and an anisotropic etchback is performed, leaving the doped polysilicon in the space previously occupied by the nitride spacers 308 to form a polysilicon gate 316, as shown in FIG. 3G. In some embodiments, the doped polysilicon is etched back below the top of the channel 310, to ensure that the gate 316 will be buried after subsequent oxidation and will not short to the contact of the drain 312. Thermal oxidation is performed to reduce or remove polysilicon stringers (e.g., along sidewalls of the oxide 406) that could interfere with subsequent CMP. Oxide (e.g., low-temperature oxide) is then deposited and CMP is performed with an end point on the drain 312, resulting in the structure of FIG. 3H. In FIG. 3H, the channel 310 is vertically situated between the drain 312 and a portion of the bit line 304 that serves as a source 318. The channel 310, drain 312, source 318, gate insulator 314, and polysilicon gate 316 constitute a vertical transistor to selectively couple a bit line 304 to a vertical conductive column to be fabricated above the vertical transistor, as illustrated below in FIGS. 4A-4H.

FIGS. 3A-3H thus provide an example of how to fabricate the transistors 208 (FIG. 2) that couple bit lines 210 to vertical conductive columns 204. The transistors fabricated as illustrated in FIGS. 3A-3H are vertical transistors because the drain 312, channel 310, and source 318 are stacked vertically and current flow through the channel 310 is substantially vertical. In other embodiments, however, the transistors 208 (FIG. 2) are fabricated as other types of transistors. For example, the transistors 208 (FIG. 2) may be fabricated as conventional horizontal silicon transistors with the source, channel and drain arranged horizontally, or as thin film transistors (TFTs). Furthermore, in FIGS. 3A-3H the bit lines 304 are doped silicon. In other embodiments, however, the bit lines 210 (FIG. 2) are implemented using doped polysilicon or metal, for example.

FIGS. 4A-4H illustrate fabrication of a three-dimensional memory array above a substrate in accordance with some embodiments. While FIGS. 4A-4H illustrate processes for fabricating an array of programmable memory elements that use solid-electrolyte resistance-switching materials, analogous processes may be used to fabricate arrays of programmable memory elements that use other types of resistance-switching materials.

Figure 4A:
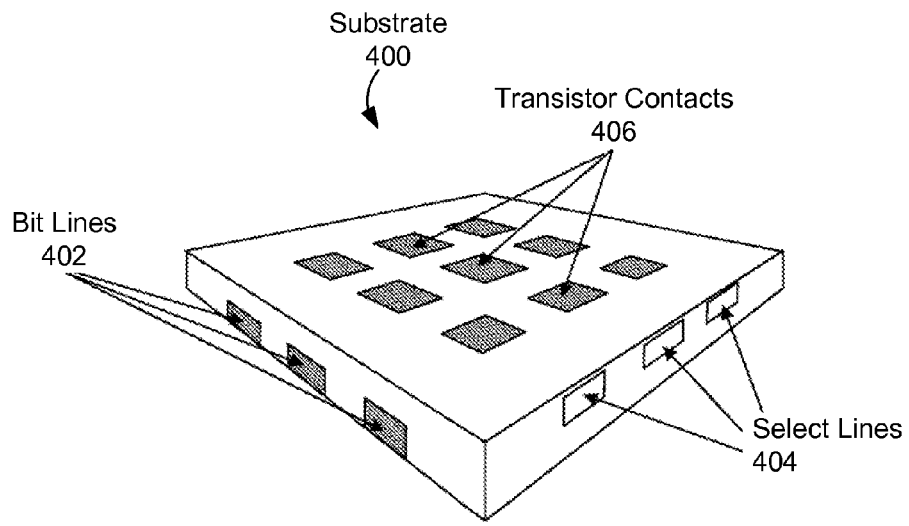
FIGS. 4A-4H illustrate various stages of fabrication of a three-dimensional memory array in accordance with some embodiments.

FIG. 4A shows a planar substrate 400 on which alternating horizontal insulating layers and conductive planes will be fabricated in accordance with some embodiments. The term "substrate" as used herein includes not merely bulk silicon or other semiconductor material (e.g., silicon 300, FIGS. 3A-3H) but also one or more layers (e.g., one or more polysilicon and/or metal layers) fabricated on the bulk silicon, and thus can include one or more layers that were the subject of patterning, deposition, or other processing. The substrate supports the alternating horizontal insulating layers and conductive planes that are fabricated on it. The substrate 400 includes a plurality of parallel signal lines/bit lines 402 that serve as bit lines 210 (FIG. 2). In some embodiments, the signal lines/bit lines 402 are fabricated in doped silicon (e.g., the bit lines 304, FIGS. 3A-3H). Alternatively, the bit lines 402 are fabricated using doped polysilicon or metal. The substrate 400 also includes a plurality of parallel select lines 404, which are an example of select lines 212 (FIG. 2), and an array of transistor contacts 406 that provide contact to corresponding transistors 208 (FIG. 2; the transistors are not shown in FIG. 4A for visual simplicity). Vertical conductive columns will be fabricated above each transistor contact 406. In some embodiments, each transistor contact 406 is a drain (e.g., drain 312, FIG. 3H) of a vertical transistor. Alternatively, each transistor contact 406 is coupled to a source or drain of another type of transistor (e.g., a conventional horizontal silicon transistor or a TFT) that is configured to selectively couple a respective bit line 402 to a vertical conductive column. A respective bit line 402 thus is configured to be selectively coupled by a plurality of transistors to a plurality of transistor contacts 406 arranged in a row (or column) in the substrate 400. A respective select line 404 is coupled to the gates of transistors that are coupled to a column (or row) of the contacts 406, to enable the transistors to selectively couple bit lines 402 to contacts 406. In some embodiments, the select lines 404 are doped polysilicon, or alternatively, metal.

Figure 4B:
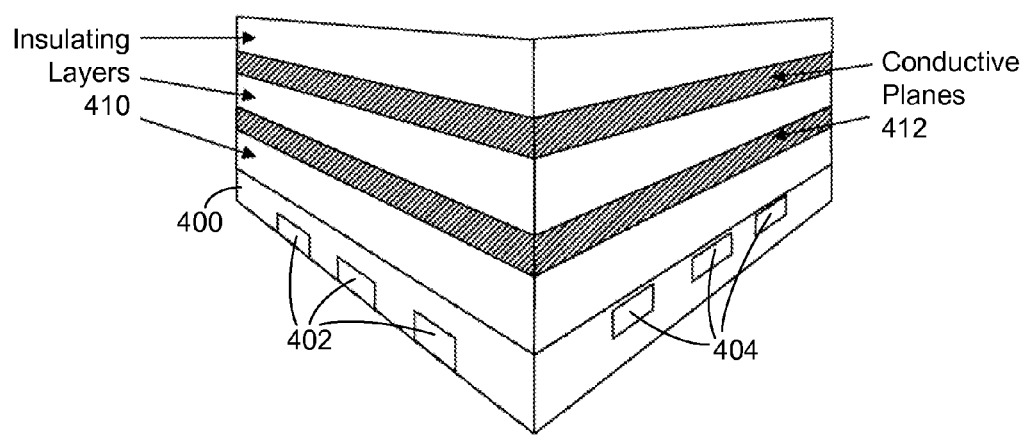

In FIG. 4B, alternating horizontal insulating layers 410 and conductive planes 412 are deposited above the substrate 400 using known techniques. The layers 410 and 412 thus are interleaved, with respective insulating layers 410 forming ILDs separating successive conductive planes 412. The conductive planes 412 are examples of conductive planes 202 (FIG. 2). While FIG. 4B shows two conductive planes 412 for simplicity, in some embodiments a memory device includes at least 2 horizontal conductive planes 412, or at least 16 horizontal conductive planes 412, or 128 horizontal conductive planes 412 or more. The conductive planes 412 are patterned but their size is large compared to the minimum photolithographic feature size, so that no photolithographic masking steps involving minimum or nearly minimum photolithographic feature sizes are performed between deposition of successive planes 410 and 412. After the deposition of each insulating layer 410, a CMP step is typically performed to ensure planarity. In some embodiments, each conductive plane 412 and/or insulating layer 410 has a thickness of approximately 50 nm.

In some embodiments, each insulating layer 410 includes silicon dioxide ($SiO_2$), or alternatively, a low-k dielectric that can be etched anisotropically with reasonable selectivity to photoresist. In some embodiments, each conductive plane 412 is a stack of multiple metallic layers (e.g., a Ti—Pt—Ti stack) that includes a layer of inert metal (e.g., platinum, Pt).

Figure 4C:
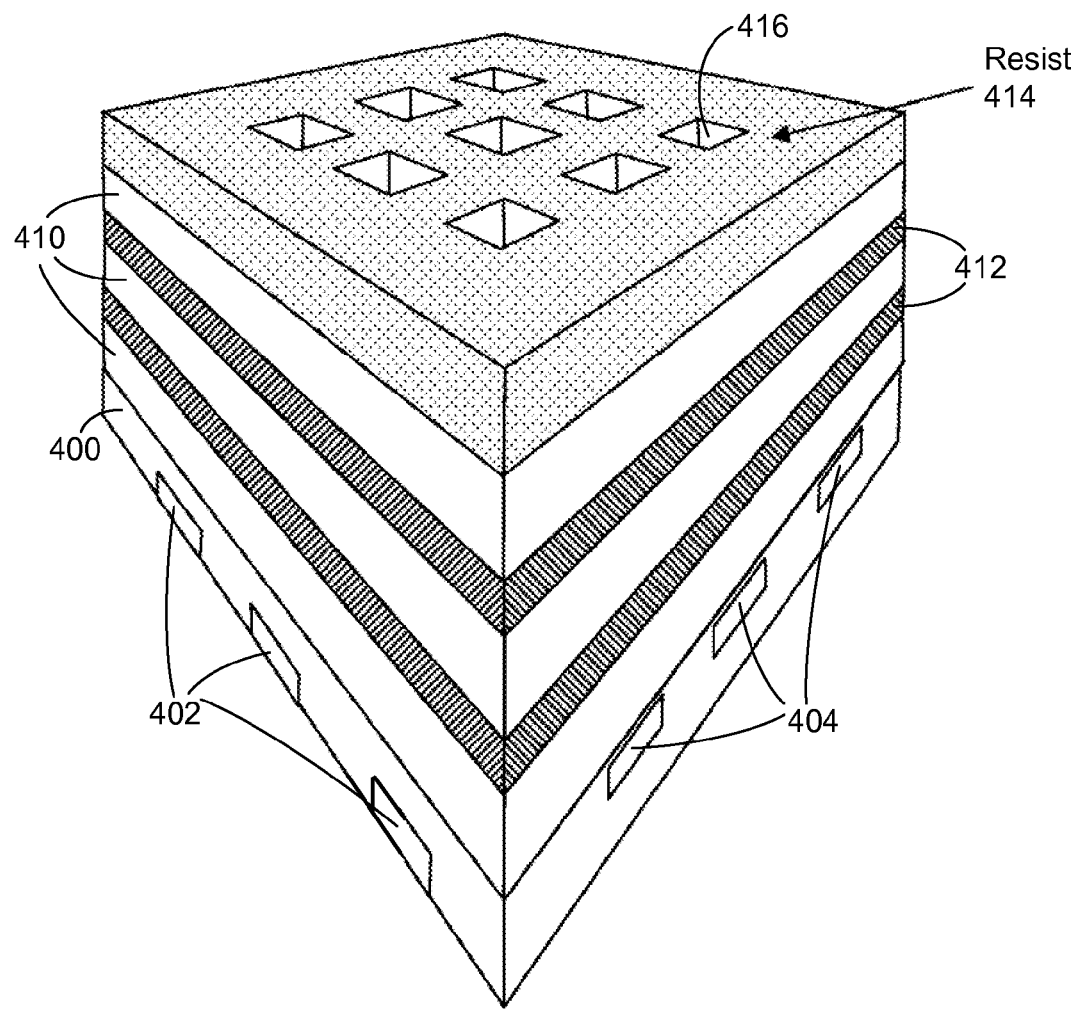
Figure 4D:
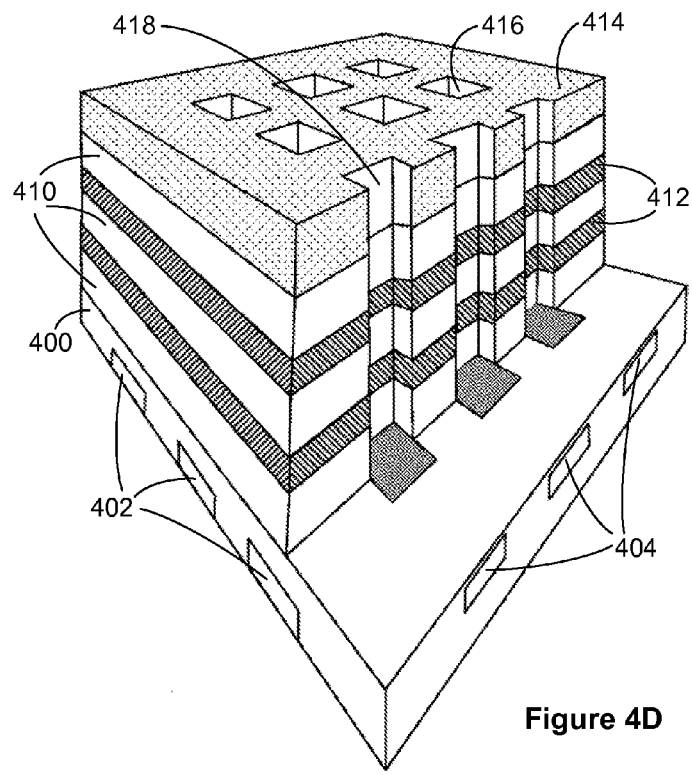
Figure 4E:
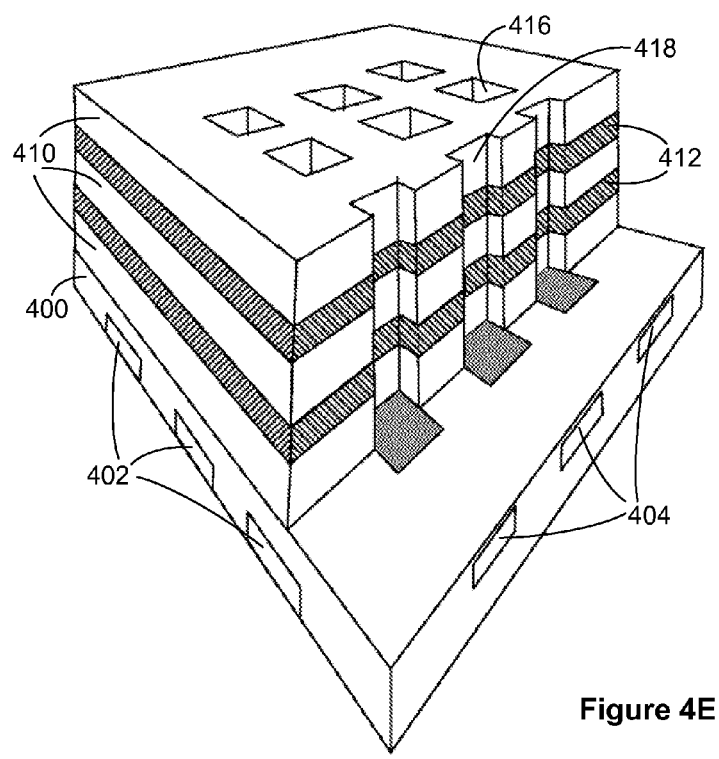

In FIG. 4C, a photoresist layer 414 is deposited on the stack of insulating layers 410 and conductive planes 412 and photolithographically patterned to form an array of vias 416. In some embodiments, the vias 416 have a diameter and pitch corresponding to the minimum available photolithographic line width (e.g., the minimum feature size provided by the highest resolution photolithographic tools available in the foundry fabricating the memory). For example, the diameter and pitch of the vias 416 may be 45 nanometers (nm), or 32 nm, or 25 nm, or 20 nm. In some embodiments, this pattern is transferred to a "hard mask" material between the stack and the resist 414. For example, a titanium (Ti) layer in a conductive plane 412 may be used as a hard mask. The vias 416 are then etched through the alternating insulating layers 410 and conductive planes 412. In some embodiments in which the conductive planes 412 are Ti—Pt—Ti stacks, titanium film is dry etched in a fluorine chemistry (e.g., $CHF_3/O_2$ or $SF_6$) and the platinum is etched in CO/NH$_3$/Xe. The final insulator etch exhibits good selectivity with respect to silicon to enable the etch to stop on the contact 406 (FIG. 4A) for embodiments in which the contact 406 is doped silicon. FIG. 4D illustrates a cut-away view of the resulting structure. Sidewalls 418 of the vias 416 are visible in this cut-away view. The resist 414 is stripped, as shown in FIG. 4E.

Figure 4F:
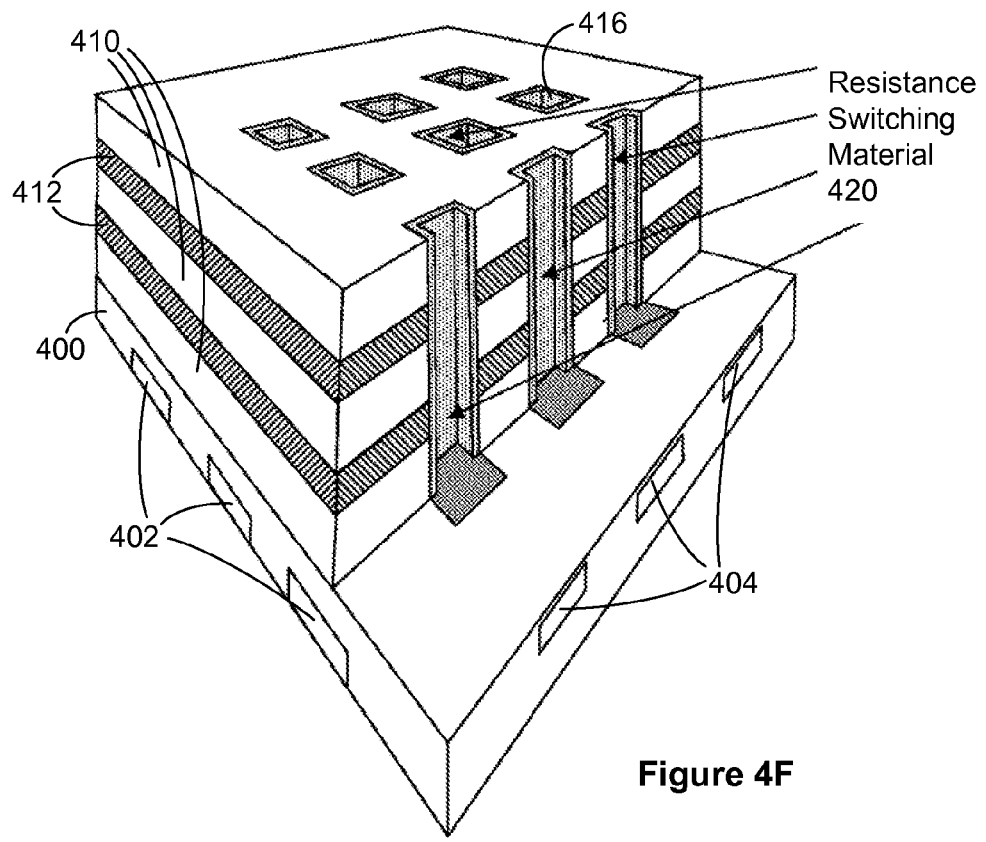
Figure 4G:
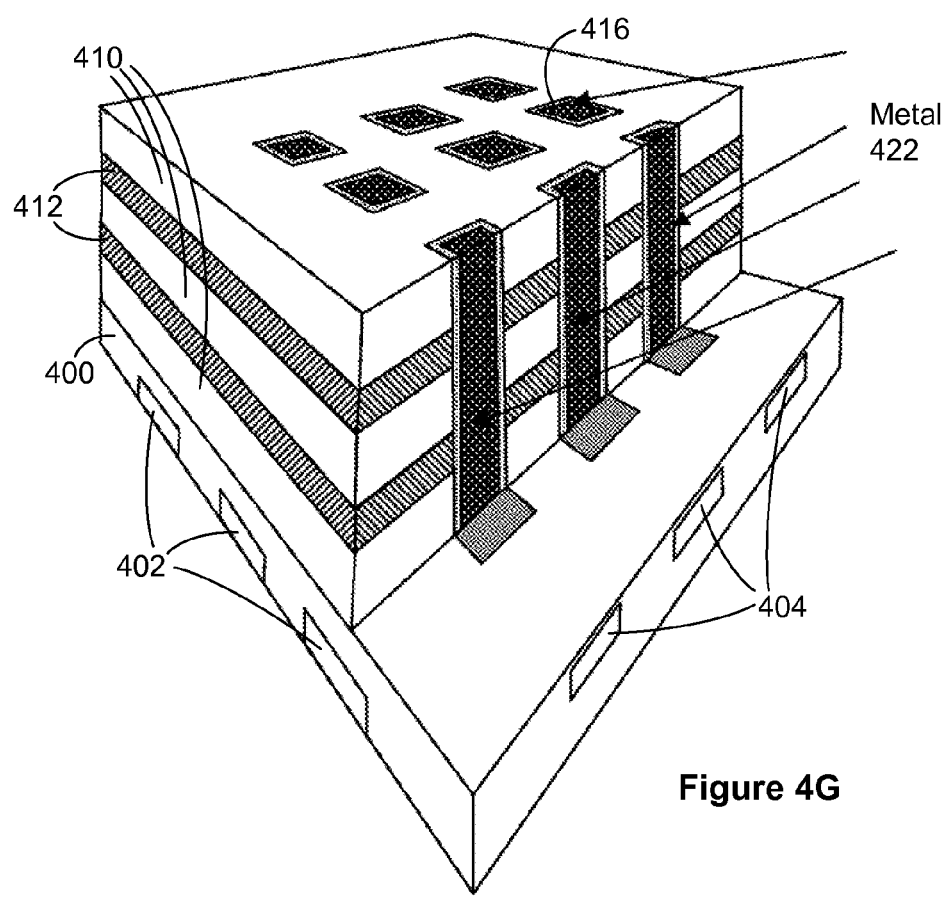

In FIG. 4F, a resistance-switching material 420 is conformally deposited on the sidewalls 418 (FIG. 4E) of the vias 416. In some embodiments, the resistance-switching material 420 is Cu-doped SiO$_2$ or pure SiO$_2$. An etch is performed to open the contacts 406 (FIG. 4A) at the bottom of the vias 416. Metal 422 (e.g., copper, Cu) then is conformally deposited (e.g., using atomic layer deposition (ALD)) in the vias 416 to fill the vias 416, as illustrated in FIG. 4G. The metal 422 in each via 416 constitutes a vertical conductive column (e.g., a column 204, FIG. 2). Each intersection of resistance-switching material 420 and metal 422 in a particular via 416 with a conductive plane 412 is a programmable memory element, or memory cell, that couples the conductive plane 412 to the vertical conductive column corresponding to the via 416. The vias 416, as filled by the resistance-switching material 420 and the metal 422, effectively form apertures in the insulating layers 410 and conductive planes 412. The resistance-switching material 420 and vertical conductive columns formed by the metal 422 pass through these apertures.

The array of programmable memory elements in FIGS. 4A-4G thus is formed using a single photolithographic masking step, because the vias 416 are defined with a single masking step. This design thus presents significant benefits relative to designs that require a large number of masking steps.

In some embodiments of the structure illustrated in FIGS. 4A-4G, the conductive planes 412 include an inert metal such as platinum. The region of the conductive plane 412 surrounding a particular via 416 serves as the inert electrode of a respective programmable memory element. Processing inert metals presents significant challenges and expenses, however. For example, inert metals are difficult to etch. Therefore, in some embodiments the conductive planes 412 are doped polysilicon and the inert electrodes are fabricated using a process known as galvanic displacement ("GD"). The use of polysilicon for the conductive planes 412 enables conventional reactive ion etch (RIE) chemistries to be used to etch the vias 416. These conventional RIE chemistries are implemented using standard foundry tools that are capable of producing high aspect ratio vias.

Figure 4H:
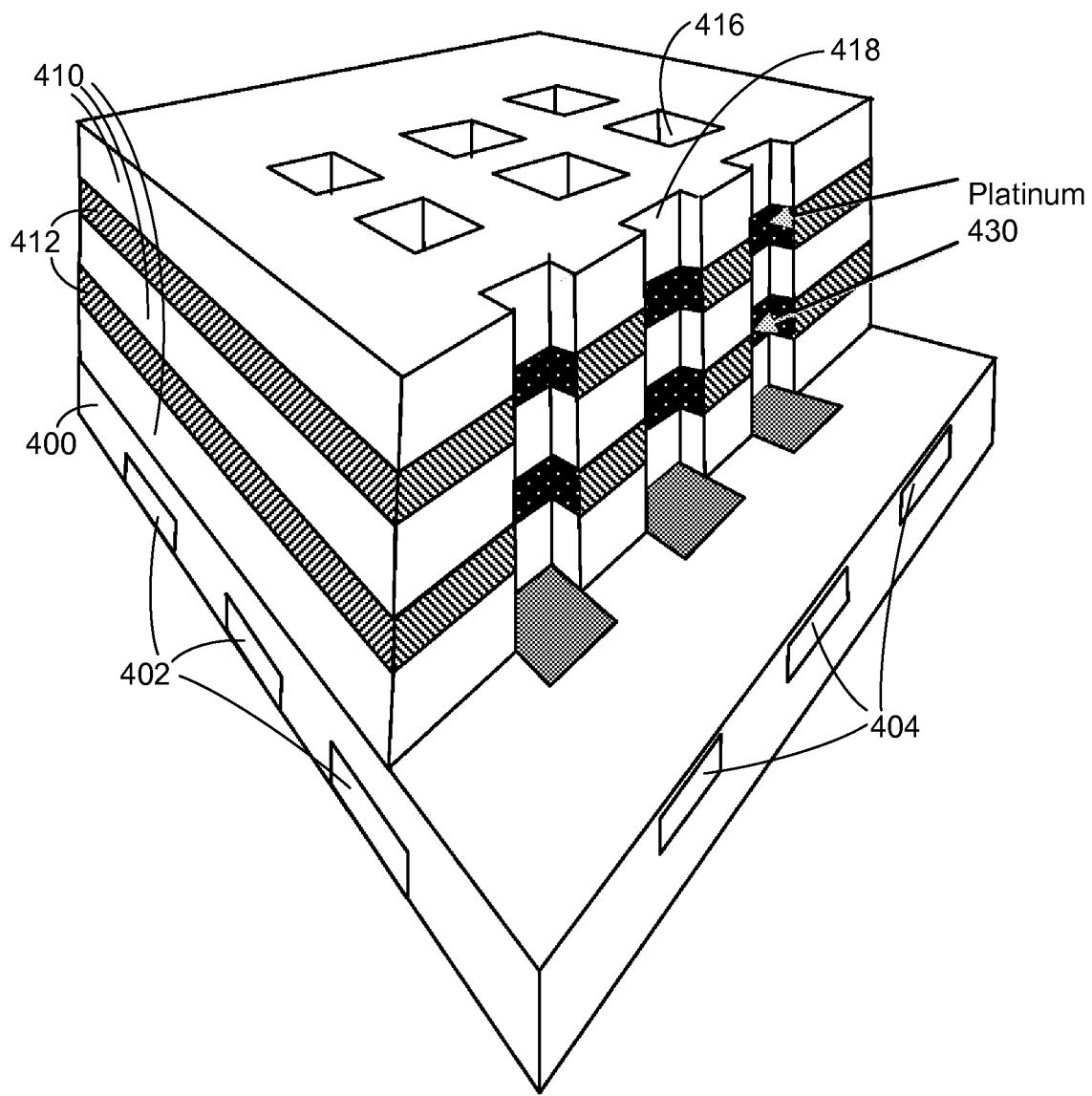

Because the conductive planes 412 are polysilicon, the etch that opens the vias 416 exposes polysilicon surfaces along the sidewalls 418 at each point where a conductive plane 412 intersects a via 416. To perform the GD process, the sidewalls 418 are exposed to an aqueous bath that contains hydrofluoric acid (HF) and a salt of a metal (e.g., an inert metal) to be deposited. The metal ions in the bath are reduced by oxidation of the exposed polysilicon surfaces along the sidewalls 418, resulting in a selective, self-limiting deposition of a film of the metal onto the exposed polysilicon. The metal thus is deposited onto the exposed polysilicon but not onto the exposed insulator along the sidewalls 418. FIG. 4H illustrates a prophetic example of the result of a GD process using a solution of HF and hexachloroplatinate to deposit platinum 430. FIG. 4H (representing deposition of an inert metal, for example by galvanic displacement) follows FIG. 4E (representing etching of the vias 416) and comes before FIG. 4F (i.e., before deposition of resistance switching material 420 along the sidewalls 418 of the vias 416) in some embodiments. As FIG. 4H shows, platinum 430 has been deposited on the portions of the sidewalls where the polysilicon conductive planes 412 intersect the vias 416 but not on the portion of the sidewalls 418 where the insulating layers 410 intersect the vias 416. Resistance-switching material 420 and metal 422 are then deposited in the vias 416, as described above with regard to FIGS. 4F-4G. The platinum 430 deposited by GD serves as the inert electrodes in the resulting programmable memory elements. Examples of other inert metals that may be deposited by GD to serve as the inert electrode include TiW and TiN.

Figure 5A:
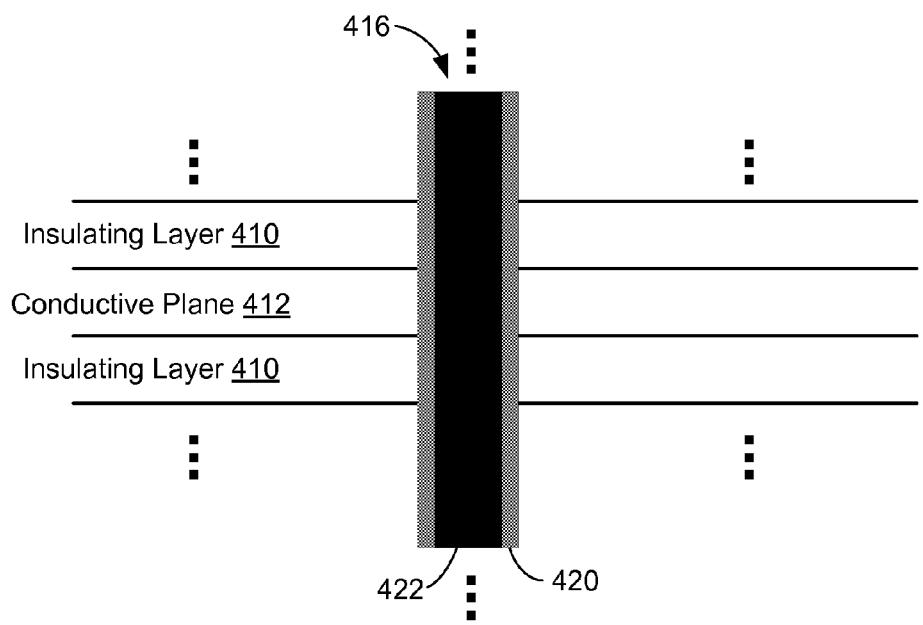
FIGS. 5A-5D show respective cross-sections and plan views of programmable memory elements in accordance with some embodiments.
Figure 5B:
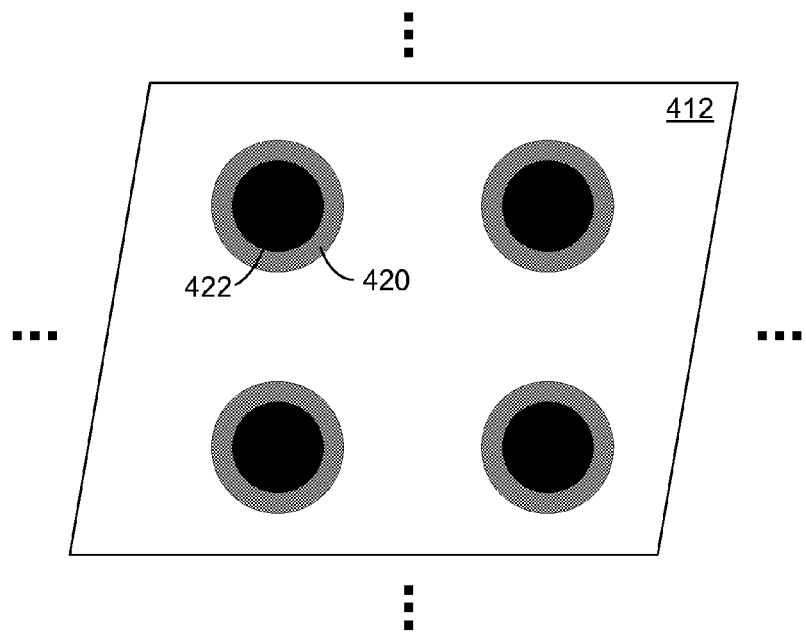

FIGS. 5A-5D show respective cross-sections and plan views of programmable memory elements fabricated in accordance with FIGS. 4A-4H. FIGS. 5A-5B illustrate a cross-section and a plan view, respectively, of a portion of a memory array in which the conductive planes 412 include an inert metal (e.g., Pt) that serves as the inert electrodes of programmable memory elements in the array in accordance with some embodiments. The conductive plane 412 intersects a via 416 with resistance-switching material 420 along the outside (e.g., pure SiO$_2$ or Cu-doped SiO$_2$) and metal 422 (e.g., Cu) within the via 416. The resistance-switching material 420 contacts the inert metal of the conductive plane 412 on one side and the metal 422 on the other side, thus creating an RRAM programmable memory element. A ring of the resistance-switching material 420 is arranged concentrically about the metal 422. The plan view of FIG. 5B illustrates four such programmable memory elements in an array. Due to the resistive properties of the resistance-switching material 420, memory elements coupled to the same column of metal 422 are electrically isolated from each other.

The combination of the resistance-switching material 420 and metal 422 for a particular programmable memory element constitute an aperture in the conductive plane 412. The resistance-switching material 420 is situated in a first portion of the aperture and the metal 422 is situated in a second portion of the aperture. While the first portion of the aperture is shown in FIG. 5B as a complete ring, it is not so limited. For example, the resistance-switching material 420 could form a partial ring or other suitable shape about the metal 422.

Figure 5C:
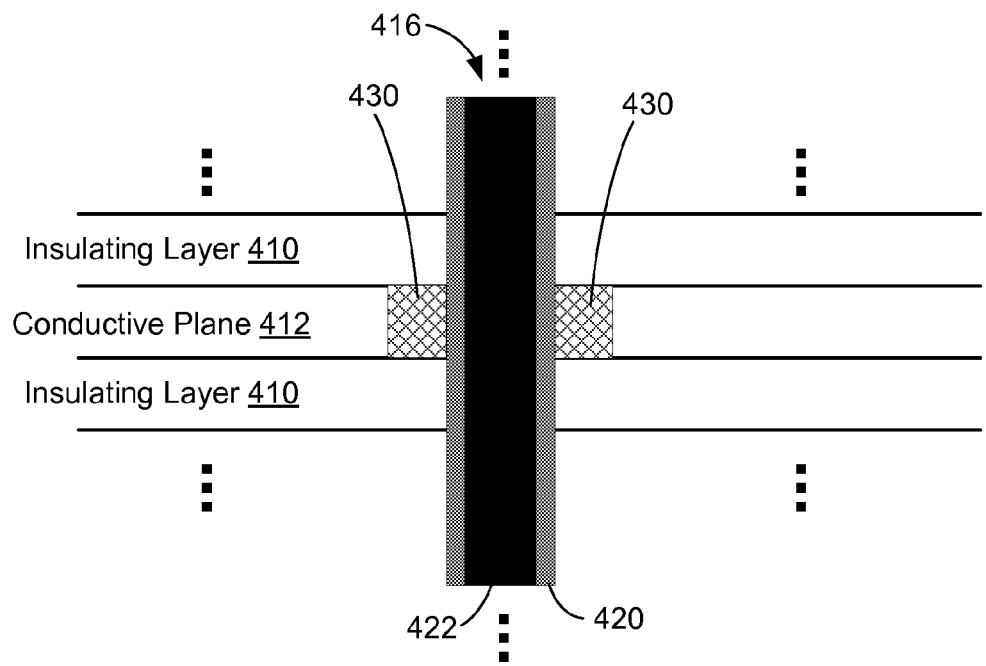
Figure 5D:
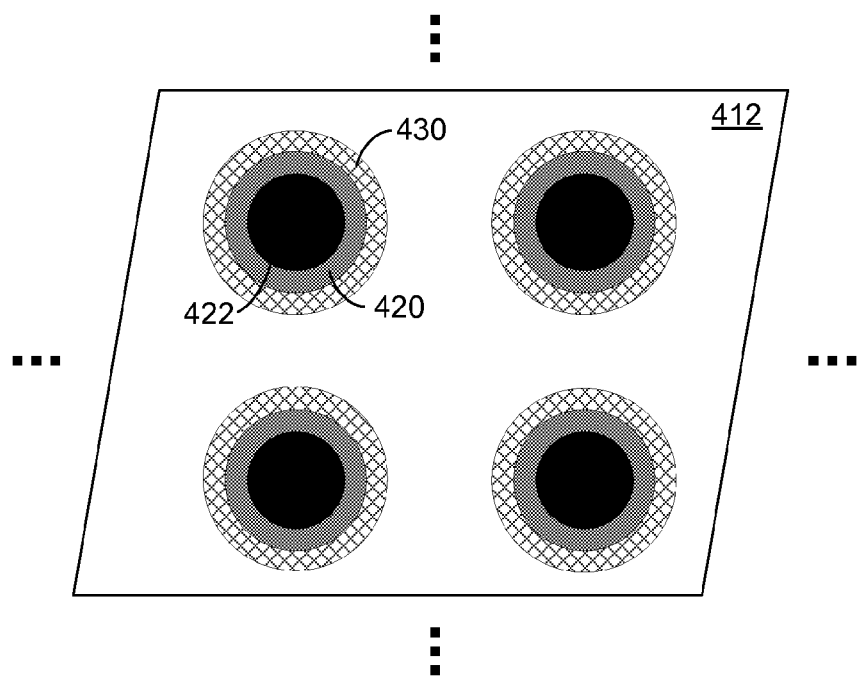

FIGS. 5C-5D illustrate a cross-section and a plan view, respectively, of a portion of a memory array in which the conductive planes 412 are doped polysilicon. A ring of platinum (or other inert metal, for example, TiW or TiN) 430 has been fabricated using a GD process around each intersection of a conductive plane 412 with a via 416, as described above with regard to FIG. 4H. Each ring of platinum 430 contacts and is concentric with a ring of resistance-switching material 420, which contacts and is arranged concentrically about the metal 422, thereby forming a programmable memory element. While the rings 420 and 422 are shown in FIG. 5D as complete rings, they are not so limited. For example, the platinum 430 and/or the resistance-switching material 420 could form partial rings or other suitable shapes about the metal 422.

Figure 6:
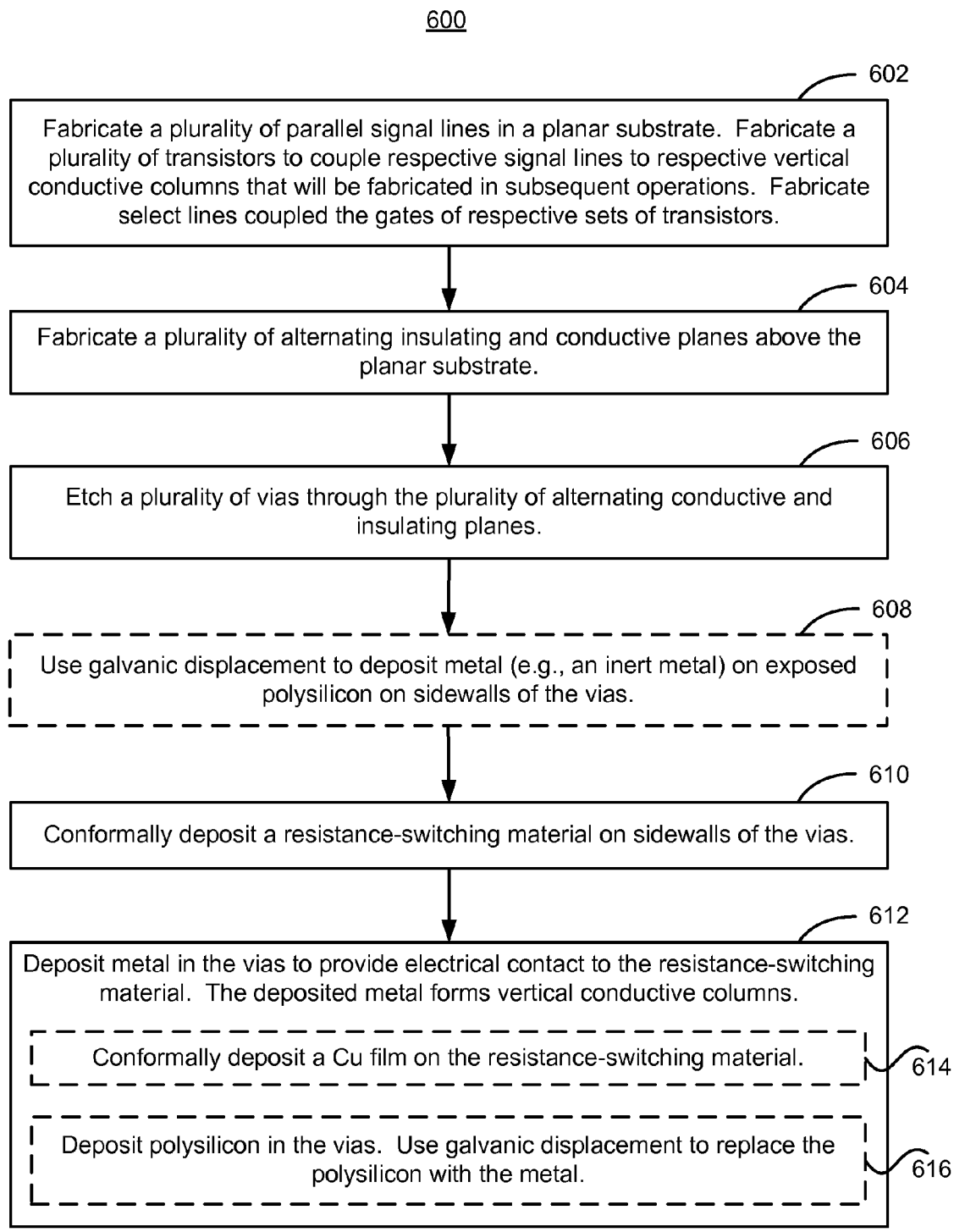
FIG. 6 is a flow diagram illustrating a method of fabricating a three-dimensional memory array in accordance with some embodiments.

FIG. 6 is a flow diagram illustrating a method 600 of fabricating a three-dimensional memory array in accordance with some embodiments. For example, the method 600 is used to fabricate a memory array with the architecture 200 of FIG. 2. FIGS. 3A-3H and 4A-4H illustrate examples of elements of a three-dimensional memory array and associated circuitry during various stages of the method 600.

In the method 600, a plurality of parallel signal lines (e.g., bit lines 304, FIG. 3A; bit lines 402, FIG. 4A) are fabricated (602) in a planar substrate (e.g., silicon 300, FIG. 3A; substrate 400, FIG. 4A). A plurality of transistors (e.g., vertical transistors as shown in FIG. 3H, including the source 318, drain 312, channel 310, and gate 316, or alternatively TFTs or conventional horizontal silicon transistors) is fabricated to couple respective signal lines to respective vertical conductive columns that will be fabricated in subsequent operations. Select lines (e.g., select lines 404, FIG. 4A) are fabricated that are coupled to the gates of respective sets of transistors.

A plurality of alternating insulating planes (e.g., insulating layers 410, FIG. 4B) and conductive planes (e.g., conductive planes 412, FIG. 4B) are fabricated (604) above the planar substrate. In some embodiments, each conductive plane includes an inert metal. In some embodiments, each conductive plane includes doped polysilicon.

In some of these embodiments, each conductive plane includes a layered stack of conductors. For example, each conductive layer includes an inert metal layer situated between metal layers that interface with adjacent insulating planes (e.g., a Ti—Pt—Ti stack).

A plurality of vias (e.g., 416, FIGS. 4C-4E) is etched (606) through the plurality of alternating conductive and insulating planes.

In some embodiments, galvanic displacement is used (608) to deposit metal (e.g., an inert metal, for example, platinum 430 (FIG. 4H), TiW, or TiN) on exposed polysilicon on sidewalls of the vias.

A resistance-switching material (e.g., material 420, FIG. 4F) is conformally deposited (610) on sidewalls (e.g., sidewalls 418, FIG. 4E) of the vias. In some embodiments, the resistance-switching material includes $SiO_2$, which may be intrinsic or doped (e.g., Cu-doped). Alternately, the resistance-switching material includes GeSe, GeS, or CuO.

Metal (e.g., metal 422, FIG. 4G) is deposited (612) in the vias to provide electrical contact to the resistance-switching material. The deposited metal forms vertical conductive columns. For example (e.g., some embodiments in which the resistance-switching material includes $SiO_2$, GeSe, GeS, or CuO), a Cu film is conformally deposited (614) on the resistance-switching material. In another example (e.g., some embodiments in which the resistance-switching material includes GeSe), the deposited metal includes silver. In some embodiments (e.g., in which the resistance-switching material is $SiO_2$), polysilicon is conformally deposited in the vias and galvanic displacement is used (616) to replace the polysilicon with the metal.

The method 600 thus provides an efficient process for fabricating a three-dimensional memory array (e.g., an array with the architecture 200 of FIG. 2). Only a single masking step (e.g., a single masking step involving minimum or nearly minimum photolithographic feature sizes) is needed to form the vias and programmable memory elements. While additional masking steps may be performed to pattern the conductive plane, these additional masking steps do not involve minimum or nearly minimum photolithographic feature sizes.

Figure 7A:
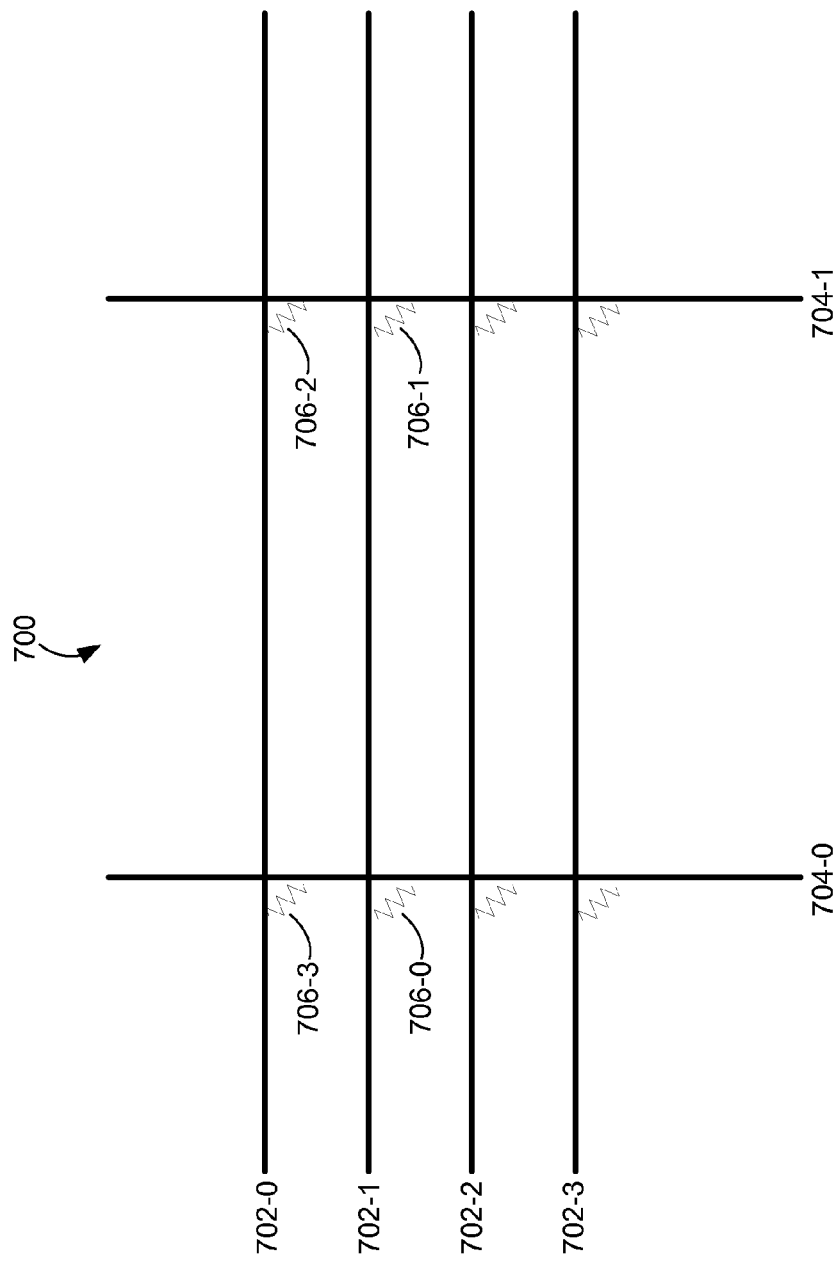
FIG. 7A is a schematic cross-section of a three-dimensional RRAM array in accordance with some embodiments.

One challenge associated with RRAM memory arrays (e.g., an array with the architecture 200 in which the programmable memory elements 206 include resistance-switching material) is the existence of parasitic leakage paths. For example, FIG. 7A shows a schematic vertical cross-section of a three-dimensional RRAM array 700 in accordance with some embodiments. In the array 700, a plurality of parallel horizontal conductive planes 702-0 through 702-3 intersect a plurality of parallel vertical conductive columns 704-0 and 704-1. An RRAM cell 706 is located at each intersection of a plane 702 and column 704. In one scenario, the cell 706-0 at the intersection of the plane 702-1 and the column 704-0 is in a high-resistance state and the other cells 706 are in low-resistance states. If the plane 702-1 is turned on, the column 704-0 is selected, and the other planes 702 and columns 704 are in a high-impedance state, there is potential for creation of a parasitic leakage path, for example, through the cells 706-1, 706-2, and 706-3 in low-resistance states.

Figure 7B:
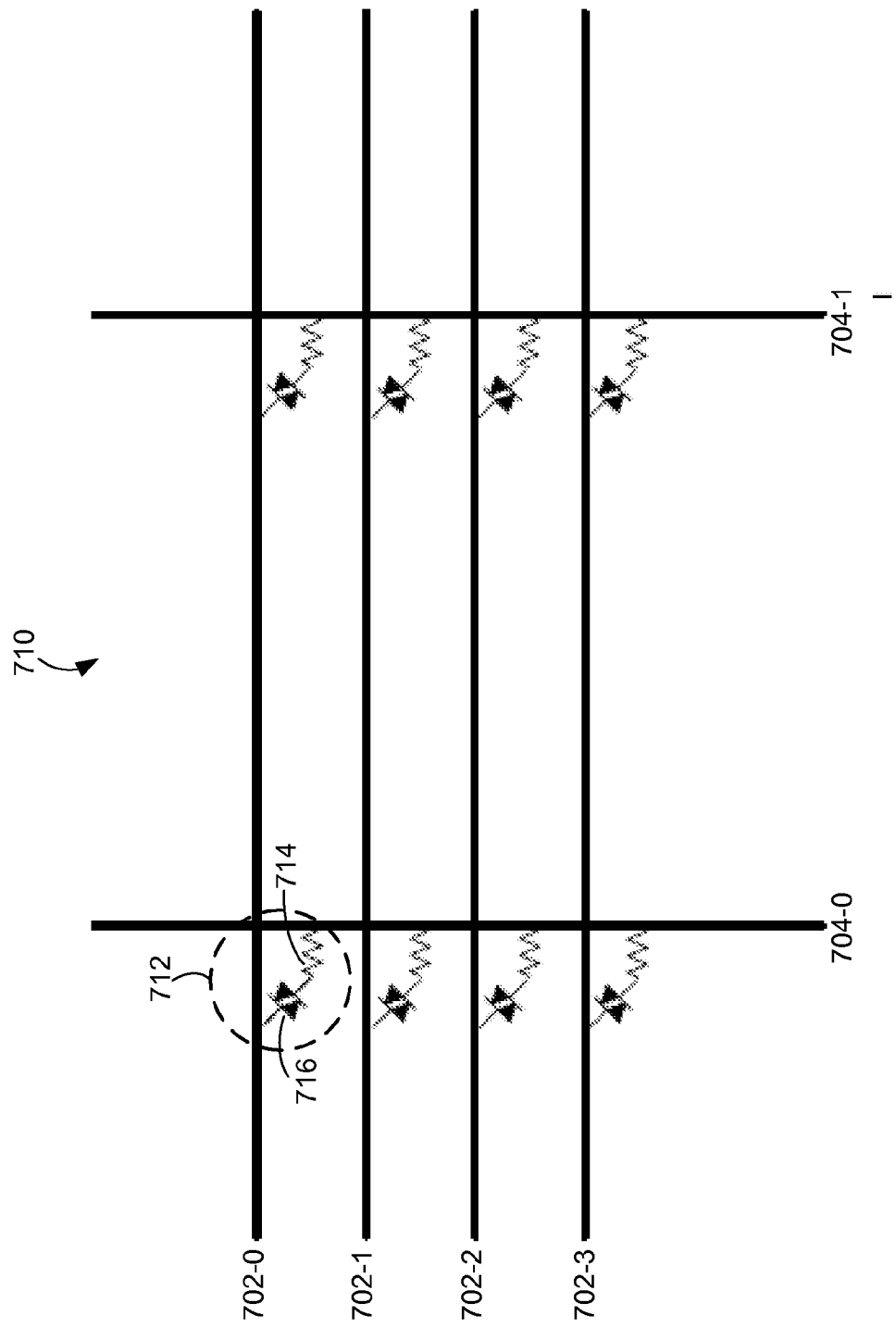
FIG. 7B is a schematic cross-section of a three-dimensional RRAM array in which each programmable memory element includes an isolation device in series with resistance-switching material in accordance with some embodiments.

The effects of parasitic leakage paths can be reduced by including an isolation device in series with the resistance-switching material in each RRAM cell (i.e., in each programmable memory element) to reduce or mitigate conduction of parasitic leakage currents through each RRAM cell. FIG. 7B shows a schematic vertical cross-section of a three-dimensional RRAM array 710 in which each programmable memory element 712 includes an isolation device 716 in series with resistance-switching material 714 in accordance with some embodiments. The isolation device 716 is implemented as two diodes wired in parallel but with opposite orientations. This configuration results in an isolation device 716 that conducts bidirectionally, but only when the magnitude of the voltage across the isolation device 716 exceeds a threshold voltage $V_{TH}$ corresponding to the diode drop. The bidirectional conductivity of the isolation device 716 allows the isolation device 716 to be used in programmable memory elements 712 for which both positive and negative voltages are applied to the resistance-switching material 714 during operation. In the array 710, parasitic leakage paths pass through multiple isolation devices 716 in series, reducing their current by orders of magnitude compared to similar parasitic leakage paths in the array 700 (FIG. 7A). Alternatively, an isolation device having unidirectional conductivity above a threshold voltage $V_{TH}$ (e.g., a diode) is situated in series with a resistance-switching material in a unipolar programmable memory element.

Figure 8:
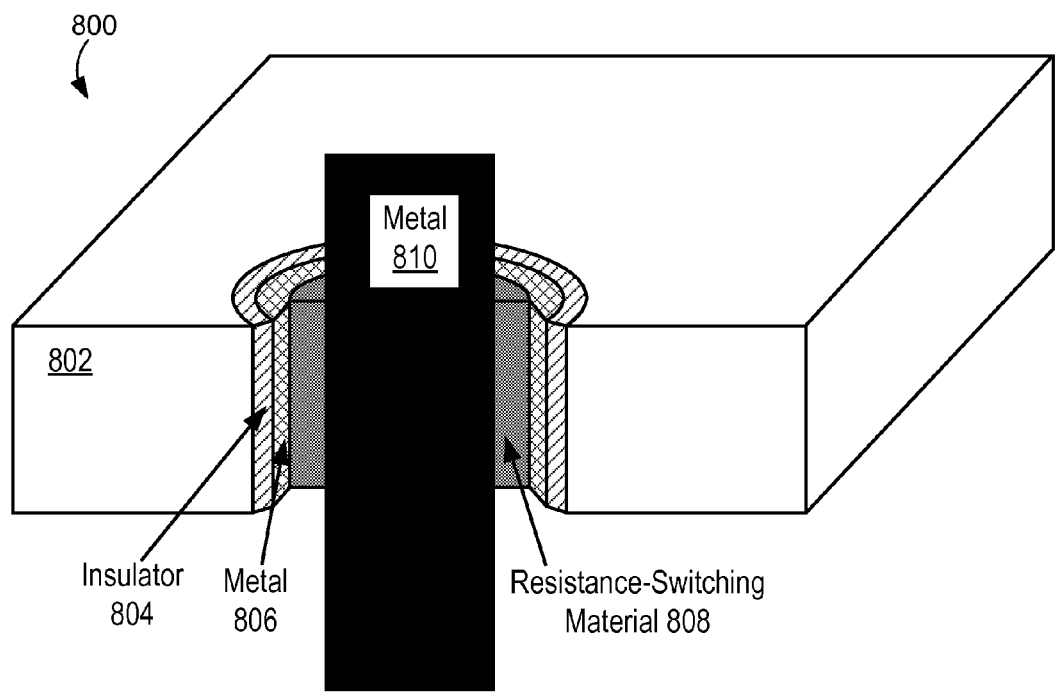
FIG. 8 illustrates a programmable memory element in which a metal-insulator-metal (MIM) isolation device is in series with resistance-switching material in accordance with some embodiments.

In some embodiments, instead of implementing the isolation devices 716 using parallel diodes with opposite orientations, isolation devices with bidirectional conductivity above a threshold voltage $V_{TH}$ are implemented as another physical structure with an I-V characteristic equivalent to the I-V characteristic of parallel diodes with opposite orientations. For example, an isolation device may include a dielectric material, or insulator, situated between two conductors, resulting in a metal-insulator-metal (MIM) structure in which the two conductors are coupled by the dielectric material. Each of the two conductors thus serves as an electrode for the MIM structure, which functions as an isolation device. FIG. 8 illustrates a programmable memory element 800 (i.e., a memory cell 800) in which a MIM structure forms an isolation device that is in series with, and distinct from, resistance-switching material 808 in accordance with some embodiments. The programmable memory element 800 is an example of a programmable memory element 206 (FIG. 2) in accordance with some embodiments. Programmable memory elements 800 may be arranged in a three-dimensional array such as in the memory architecture 200 (FIG. 2) in accordance with some embodiments.

In the programmable memory element 800, a horizontal conductive plane 802 forms the first conductor of the MIM structure. Concentric rings of an insulating film 804 and a metal layer 806, situated in an aperture in the conducting plane 802, form the insulator and second conductor of the MIM structure respectively. In some embodiments the insulating film 804 has a thickness of less than 20 Å, or as little as 10 Å. The metal layer 806 also serves as a first electrode for a ring of resistance-switching material 808, which is concentric with the rings of insulating film 804 and metal 806 in the aperture. Metal 810 forms a vertical conductive column that passes through the aperture and serves as a second electrode for the ring of resistance-switching material 808. While the insulating film 804, metal layer 806, and resistance-switching material 808 are illustrated as concentric rings in FIG. 8, they are not so limited; more generally, the insulating film 804, metal layer 806, and resistance-switching material 808 each occupy respective portions of the aperture in the conductive plane 802 such that the MIM structure is in series with the resistance-switching material 808.

Figure 9:
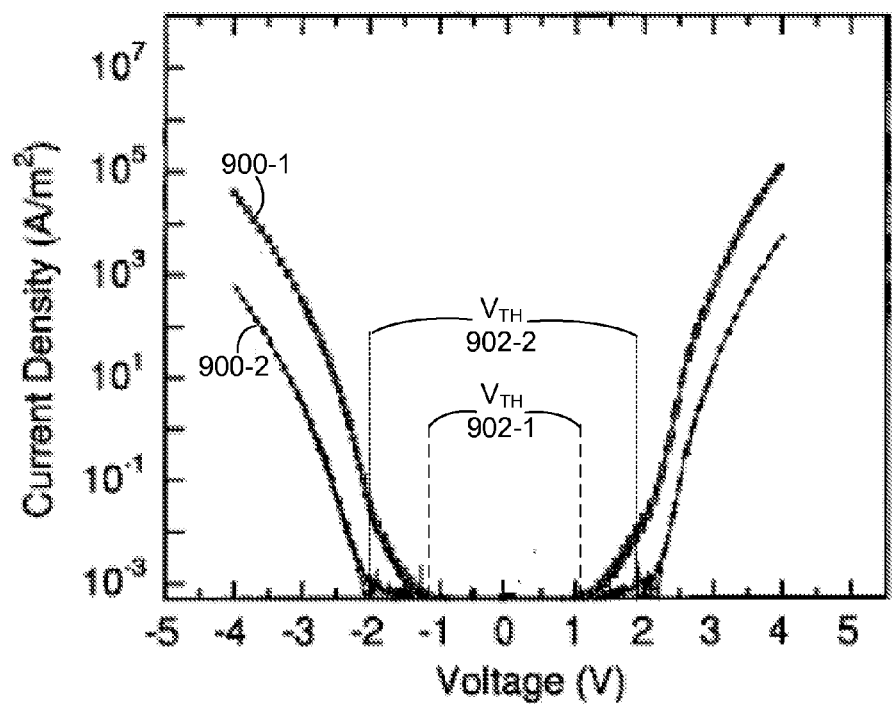
FIG. 9 illustrates examples of I-V characteristics of MIM structures in accordance with some embodiments.

FIG. 9 illustrates examples of I-V characteristics 900-1 and 900-2 of MIM structures in accordance with some embodiments. For example, the I-V characteristics 900-1 and 900-2 correspond to MIM structures formed by the conductive plane 802, insulating film 804, and metal 806 (FIG. 8) in accordance with some embodiments. The I-V characteristic 900-1 illustrates bidirectional conductivity above a threshold voltage $V_{TH}$ 902-1. The conductivity is bidirectional because the corresponding MIM structure conducts when the magnitude of the voltage across the MIM structure exceeds $V_{TH}$ 902-1, regardless of whether the voltage across the MIM structure is negative or positive. Similarly, the I-V characteristic 900-2 illustrates bidirectional conductivity above a threshold voltage $V_{TH}$ 902-2. In some embodiments, the I-V characteristics 900-1 and 900-2 correspond to the same structure, with the differences between the I-V characteristics 900-1 and 900-2 resulting from differences in processing. For example, the MIM structure corresponding to the I-V characteristic 900-2 may have received a higher-temperature anneal than a similar MIM structure corresponding to the I-V characteristic 900-1. While the I-V characteristics 900-1 and 900-2 show symmetrical bidirectional conductance above $V_{TH}$ 902-1 and 902-2, the bidirectional conductance need not be symmetrical.

Figure 10A:
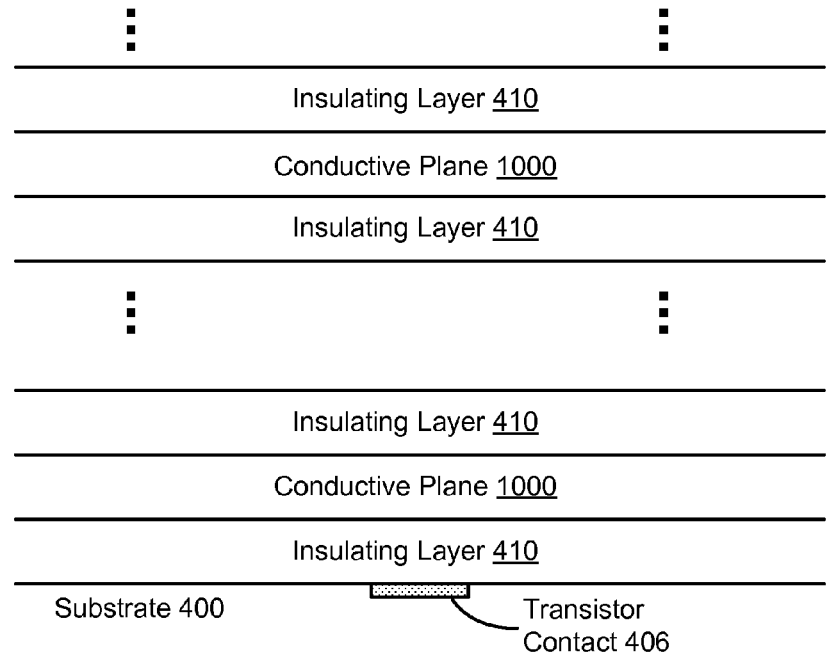
FIGS. 10A-10G illustrate cross-sections of an array of programmable memory elements during successive stages of fabrication in accordance with some embodiments.

FIGS. 10A-10F illustrate cross-sections of an array of programmable memory elements 800 (FIG. 8) during successive stages of fabrication in accordance with some embodiments. In FIG. 10A, alternating horizontal insulating planes 410 and conductive planes 1000 have been deposited above a substrate 400 (FIG. 4A). In some implementations, the conductive planes 1000 are aluminum. In some embodiments, each conductive plane 1000 and/or insulating layer 410 has a thickness of approximately 50 nm.

Figure 10B:
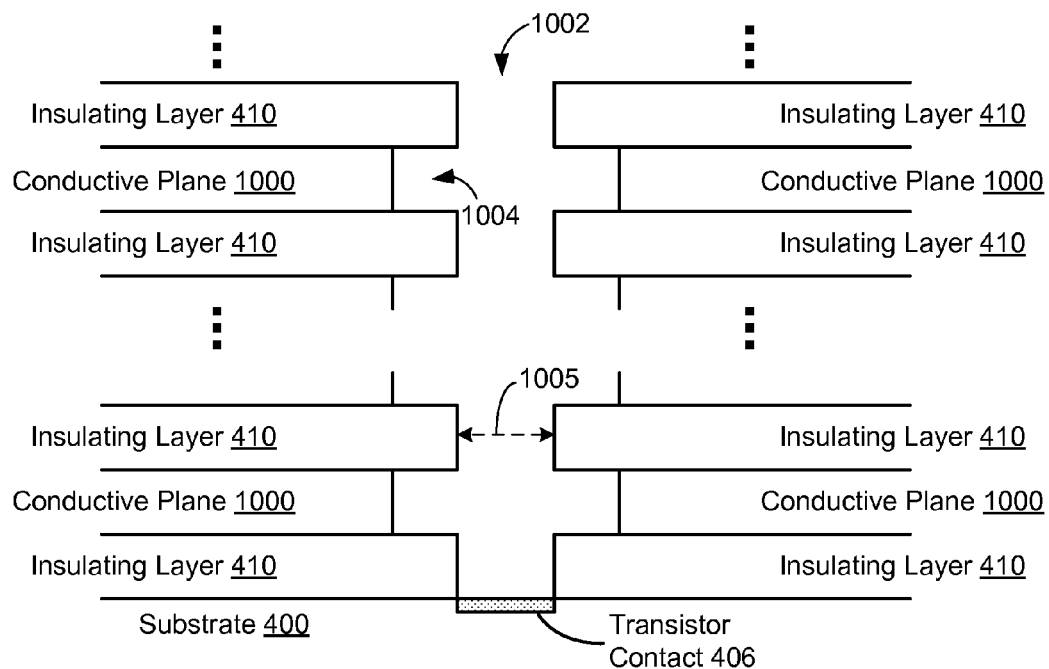

In FIG. 10B, vias 1002 are etched through the insulating planes 410 and conductive planes 1000. In some embodiments, the vias 1002 have a diameter 1005 of 0.2 microns. The vias 1002 terminate on transistor contacts 406 (FIG. 4A). The etch that forms the vias 1002 undercuts the conductive planes 1000 as exposed along sidewalls of the vias 1002 to form recesses 1004 along the sidewalls.

Figure 10C:
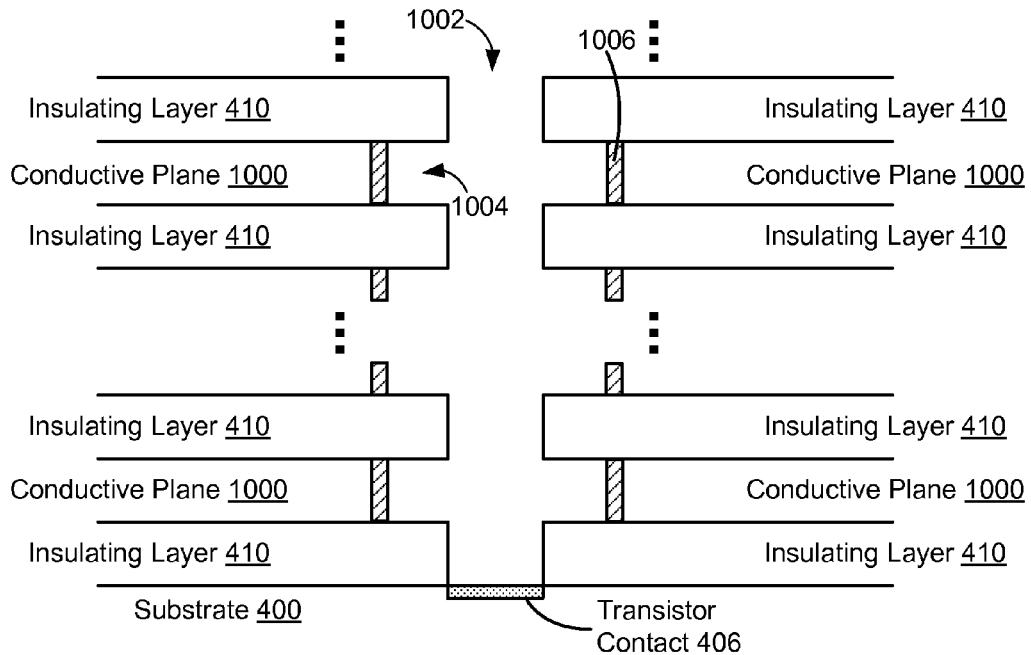

In FIG. 10C, an insulator 1006 is formed in the recesses 1004. The insulator 1006 separates the conductive plane 1000 from the open via 1002. In some embodiments, if the conductive plane 1000 is aluminum, the insulator 1006 is fabricated by anodizing the exposed aluminum in the recesses 1004 to form $Al_2O_3$ (sapphire). The insulator 1006 is an example of an insulator 804 (FIG. 8).

Figure 10D:
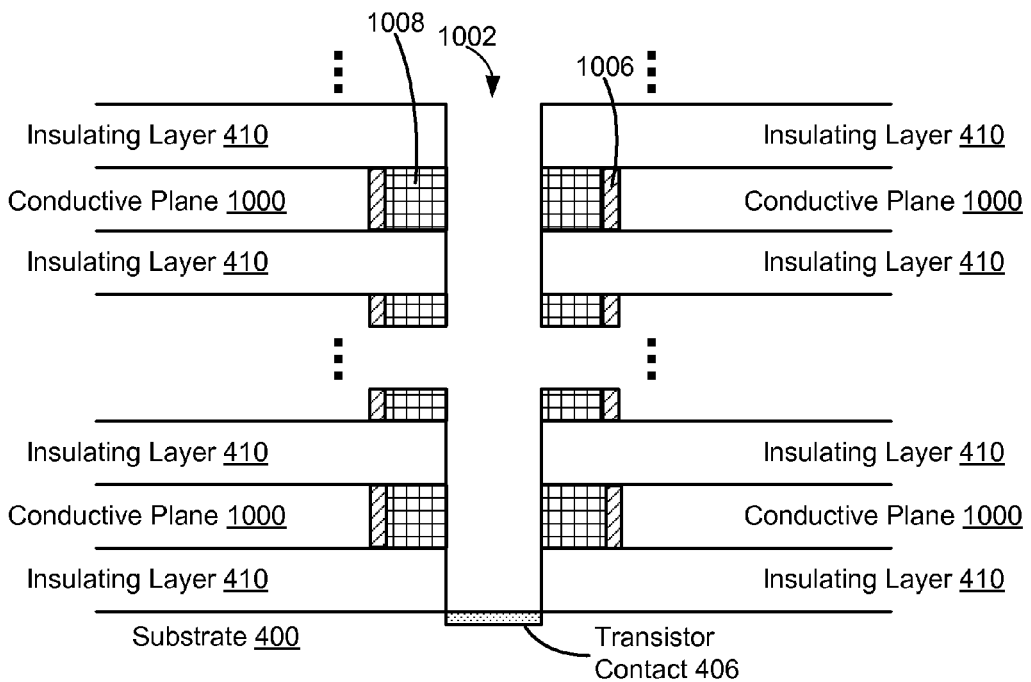
Figure 10E:
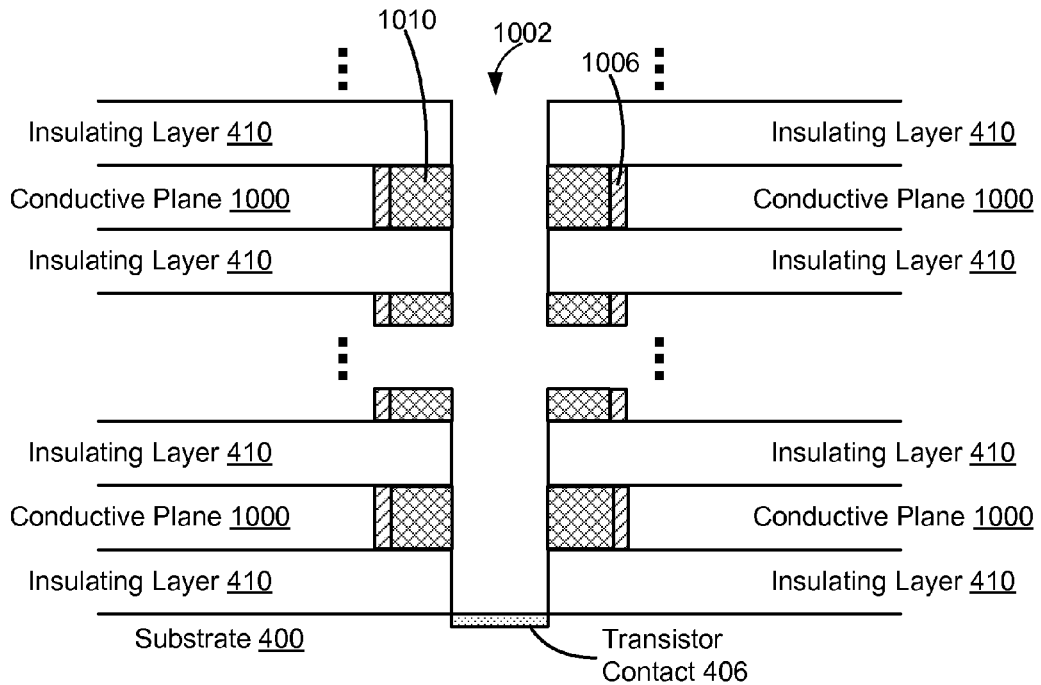

In FIG. 10D, the recesses 1004 have been filled with polysilicon ("poly-Si") 1008 by conformally depositing poly-Si in the via 1002 and then performing an etch to remove the poly-Si from the sides and bottom of the via 1002, leaving poly-Si only in the recesses 1004. Galvanic displacement is then performed to replace the poly-Si 1008 with metal 1010 (e.g., an inert metal, for example, Pt, TiW, or TiN), as illustrated in FIG. 10E. The metal 1010 is an example of metal 806 (FIG. 8).

Alternatively, deposition of poly-Si 1008 is omitted and the metal 1010 is conformally deposited in the vias 1002 and then etched to remove the metal 1010 not in the recesses 1004.

Figure 10F:
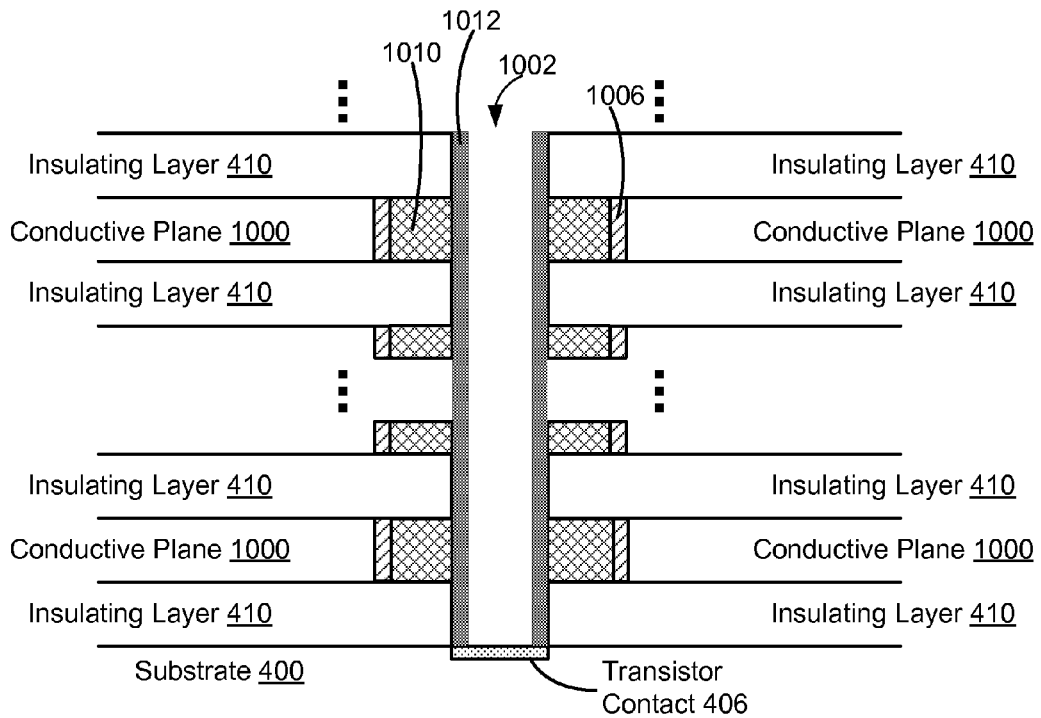
Figure 10G:
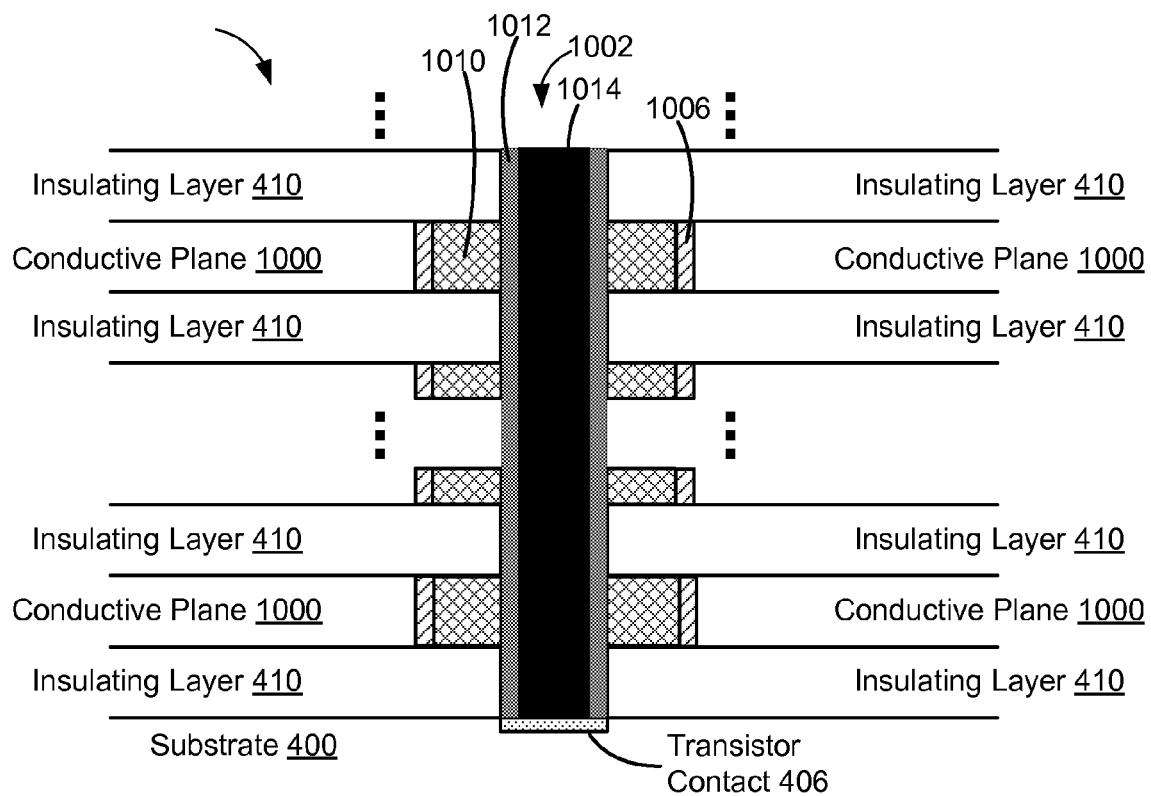

Resistance-switching material 1012 (e.g., pure or Cu-doped $SiO_2$) is conformally deposited on the sidewalls of the vias 1012, as illustrated in FIG. 10F. The resistance-switching material 1012 is an example of resistance-switching material 808 (FIG. 8). The vias 1002 are then filled with metal 1014 (e.g., Cu), which forms vertical conductive columns that connect to respective transistor contacts 406, as illustrated in FIG. 10G. The metal 1014 is an example of metal 810 (FIG. 8). The FIGS. 10A-10G thus illustrate formation of programmable memory elements 800 (FIG. 8) at each intersection of a conductive plane 1000 and via 1002: the conductive plane 1002, insulator 1006, and metal 1010 form a MIM structure that functions as an isolation device and is in series with the resistance-switching material 1012. The metal 1010 is a common electrode for both the isolation device and the resistance-switching material 1012.

Figure 11:
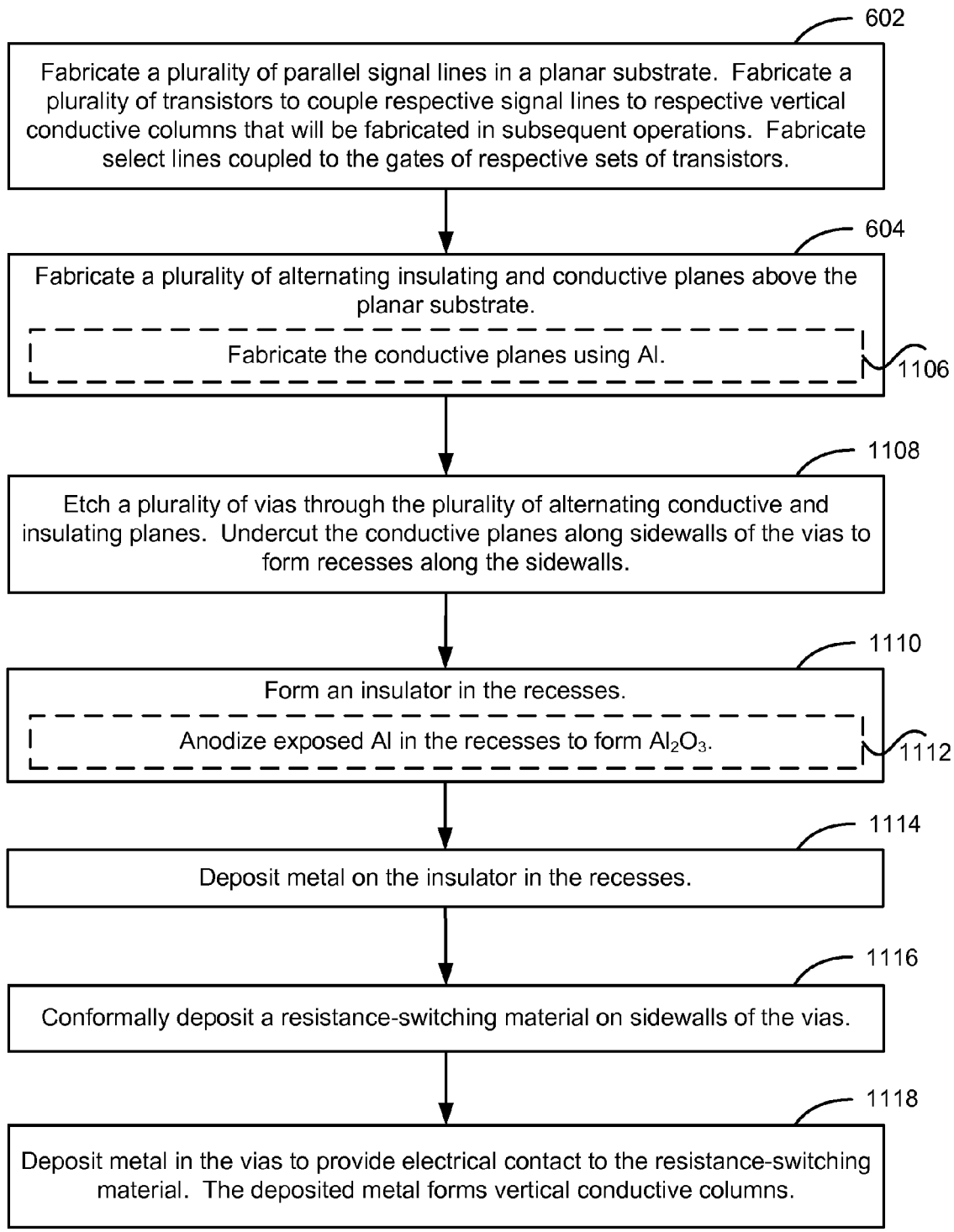
FIG. 11 is a flow diagram illustrating a method of fabricating a three-dimensional memory array in accordance with some embodiments.

FIG. 11 is a flow diagram illustrating a method 1100 of fabricating a three-dimensional memory array in accordance with some embodiments. For example, the method 1100 is used to fabricate a memory array with the architecture 200 of FIG. 2, with programmable memory elements 206 that include resistance-switching material in series with isolation devices with bidirectional conductance above a threshold voltage (e.g., programmable memory elements 800, FIG. 8). FIGS. 10A-10G illustrate examples of elements of such a three-dimensional memory array during various stages of the method 1100.

In the method 1100, a plurality of parallel signal lines is fabricated (602) in a planar substrate. A plurality of transistors is fabricated to couple respective signal lines to respective vertical conductive columns that will be fabricated in subsequent operations. Select lines are fabricated that are coupled to the gates of respective sets of transistors. The operations 602 are performed as described for the method 600 (FIG. 6).

A plurality of alternating insulating and conductive planes (e.g., insulating layers 410 and conductive planes 1000, FIG. 10A) is fabricated (604) above the planar substrate (e.g., substrate 400, FIG. 10A). In some embodiments, the conductive planes are fabricated (1106) using aluminum.

A plurality of vias (e.g., vias 1002, FIG. 10B) is etched (1108) through the plurality of alternating conductive and insulating planes. The conductive planes are undercut along sidewalls of the vias to form recesses (e.g., recesses 1004, FIG. 10B) along the sidewalls.

An insulator (e.g., insulator 1006, FIG. 10C) is formed (1110) in the recesses. In some embodiments in which the conductive planes are aluminum, exposed aluminum in the recesses is anodized (1112) to form $Al_2O_3$.

Metal is deposited (1114) on the insulator in the recesses. In some embodiments, the metal is deposited using galvanic displacement: poly-Si (e.g., poly-Si 1008, FIG. 10D) is deposited in recesses along the via sidewalls and GD is performed to replace the poly-Si with metal (e.g., metal 1010, FIG. 10E) (e.g., an inert metal, for example, Pt, TiW, or TiN). Alternatively, metal is conformally deposited along the via sidewalls and then etched to remove the metal not in the recesses.

A resistance-switching material (e.g., resistance-switching material 1012, FIG. 10F) is conformally deposited (1116) on sidewalls of the vias. Metal (e.g., metal 1014, FIG. 10G) is deposited (1118) in the vias to provide electrical contact to the resistance-switching material. The deposited metal forms vertical conductive columns.

The method 1100 thus provides an efficient process for fabricating a three-dimensional memory array. Only a single masking step is needed to form the vias and programmable memory elements. In some embodiments, GD allows inert metal to be deposited without having to etch the inert metal.

Attention is now directed to reading and writing RRAM programmable memory elements (i.e., RRAM cells) in the memory architecture 200 (FIG. 2). Types of operations for writing to (i.e., programming) an RRAM cell include unipolar pulsing, bipolar pulsing, and time-dependent pulsing for phase-change memories. RRAM cells in the memory architecture 200 (FIG. 2) may be either bipolar or unipolar, for example, or may be phase-change memories. Generally insulating RRAM is unipolar. Generally solid-electrolyte RRAM is bipolar and sometimes can be operated in a unipolar mode. Bipolar devices typically have some physical asymmetry, for example, electrodes of differing materials. Creation of a low-resistance state in an RRAM cell is referred to as a "SET" operation and creation of a high-resistance state in an RRAM cell is referred to as a "RESET" operation.

Figure 12A:
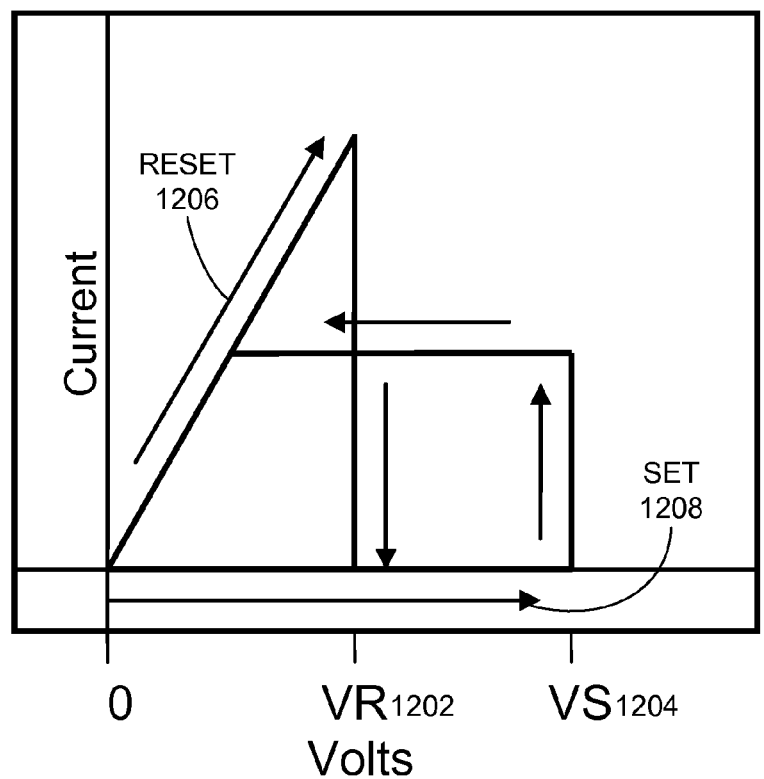
FIG. 12A illustrates SET and RESET operations for a unipolar RRAM cell in accordance with some embodiments.

FIG. 12A illustrates current versus voltage curves for a unipolar RRAM cell (e.g., a unipolar RRAM programmable memory element 206, FIG. 2) in accordance with some embodiments. For the unipolar cell, a high-resistance state is created if the voltage of a pulse applied to the cell is greater than or equal to a RESET voltage $V_R$ 1202 and less than a SET voltage $V_S$ 1204, as shown for the RESET operation 1206. A low-resistance state is created if the voltage of the pulse applied to the cell is greater than or equal to the SET voltage $V_S$ 1204, as shown for the SET operation 1208.

Figure 12B:
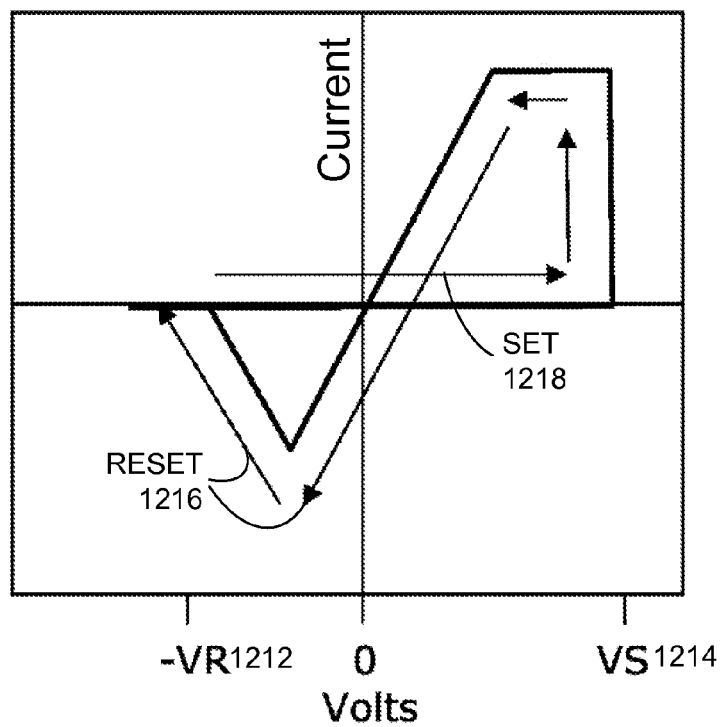
FIG. 12B illustrates SET and RESET operations for a bipolar RRAM cell in accordance with some embodiments.

FIG. 12B illustrates current versus voltage curves for a bipolar RRAM cell (e.g., a bipolar RRAM programmable memory element 206, FIG. 2) in accordance with some embodiments. Resistance-switching material in a bipolar cell is referred to as being bidirectional. For a bipolar cell, the voltage applied in a RESET operation is opposite in polarity to the voltage applied in a SET operation. A high-resistance state is created if a voltage of a pulse applied to the cell has a first polarity (shown in FIG. 12B as negative) and a magnitude greater than or equal to a RESET voltage $V_R$ 1212, as shown for the RESET operation 1216. A low-resistance state is created if a voltage of a pulse applied to the cell has a second polarity (shown in FIG. 12B as positive) opposite to the first polarity and a magnitude greater than or equal to a SET voltage $V_S$ 1214, as shown for the SET operation 1218.

For time-dependent pulsing of a phase-change memory element, a SET operation is performed by quickly extinguishing an applied current pulse and a RESET operation is performed by gradually reducing an applied current pulse. The current pulse is used to melt the resistance element material. If this current pulse is quickly extinguished, the material cools rapidly, quenching the material into an amorphous state that has a low conductivity. If the current is gradually reduced over time, the material forms a crystalline structure that has a high conductivity.

SET and RESET operations for a single programmable memory element 206 (FIG. 2) located at the intersection of a conductive plane 202 and a vertical conductive column 204 are performed by applying a voltage between the conductive plane 202 and a bit line 210 coupled to the vertical conductive column 204. The bit line 210 is coupled to the vertical conductive column 204 by applying a voltage to a select line 212 to turn on transistors 208 including the transistor 208 coupled to the vertical conductive column 204. Conductive planes 204 that are not involved in a particular SET or RESET operation are held in a high-impedance "Z" state (i.e., are tristated) to prevent unintended programming of elements 206 in those planes that are associated with columns 204 selected by the select line 212. Because each programmable memory element 206 can be individually addressed for both SET and RESET operations, separate erase operations are not required.

Figure 13A:
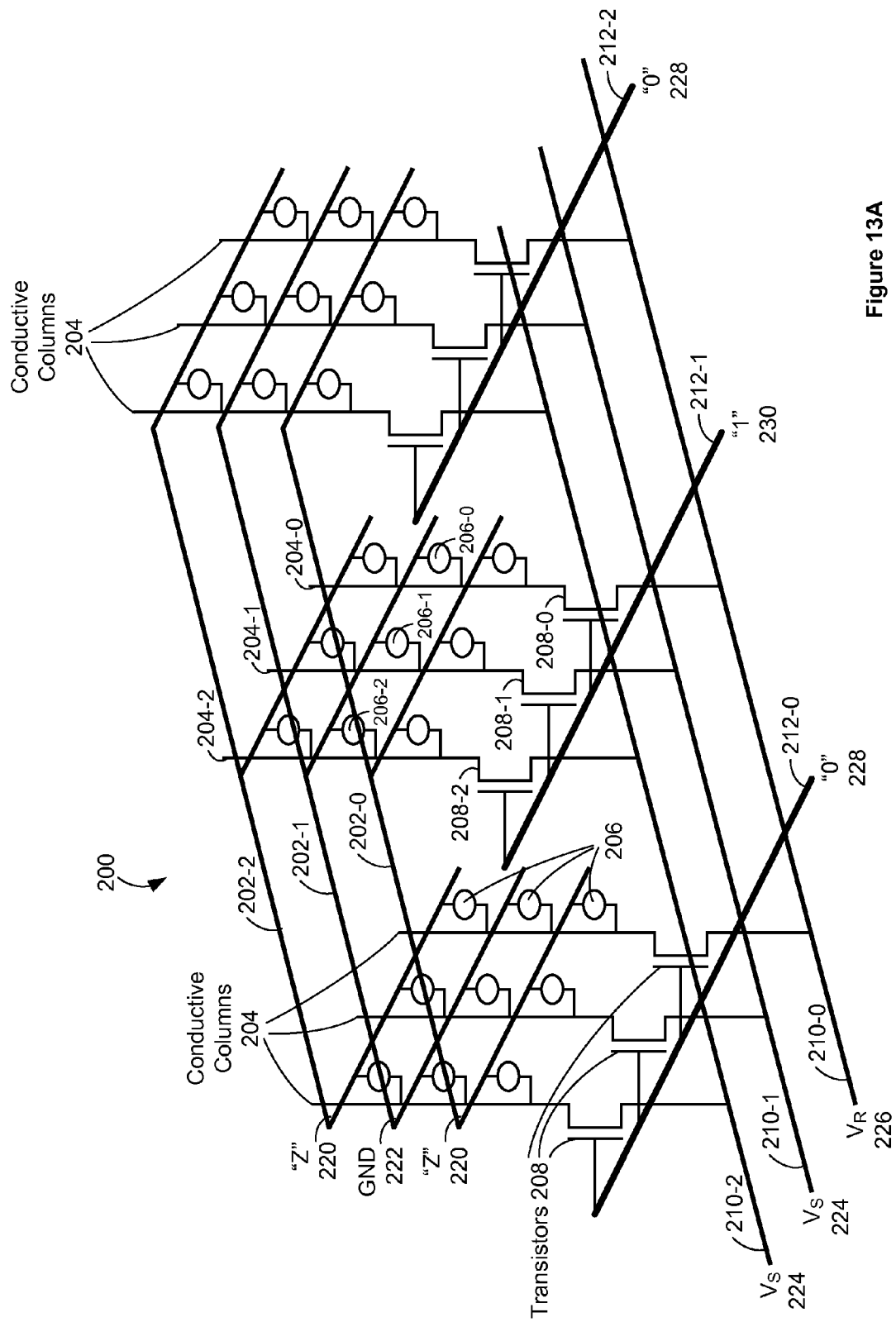
FIG. 13A illustrates SET and RESET operations for unipolar programmable memory elements in a memory architecture with horizontal conductive planes and vertical conductive columns in accordance with some embodiments.

FIG. 13A illustrates SET and RESET operations for unipolar programmable memory elements 206 in the memory architecture 200 in accordance with some embodiments. Specifically, FIG. 13A illustrates simultaneous SET operations for programmable memory elements 206-1 and 206-2 and a RESET operation for the programmable memory element 206-0. The conductive plane 202-1 is selected by grounding (GND 222) the plane 202-1 while other conductive planes 202-0 and 202-2 are tristated ("Z" 220) and thus deselected. Vertical conductive columns 204-0, 204-1, and 204-2, which are arranged in a row, are selected by applying a voltage corresponding to a logic high ("1" 230) to the select line 212-1, thereby turning on the transistors 208-0, 208-1, and 208-2. Turning on the transistors 208-0, 208-1, and 208-2 couples the vertical conductive columns 204-0, 204-1, and 204-2 to respective bit lines 210-0, 210-1, and 210-2. Other rows of vertical conductive columns 204 remain deselected, as illustrated by application of a voltage (e.g., GND) corresponding to a logic low ("0" 228) to the select lines 212-0 and 212-2; the corresponding transistors 208 with gates coupled to the select lines 212-0 and 212-2 remain off and thus do not couple their respective columns 204 to the bit lines 210. A SET voltage $V_S$ 224 is simultaneously applied to the bit lines 210-1 and 210-2 and thereby to the elements 206-1 and 206-2, producing low-resistance states in the elements 206-1 and 206-2. Simultaneously, a RESET voltage $V_R$ 226 is applied to the bit line 210-0 and thereby to the element 206-0, producing a high-resistance state in the element 206-0. If low-resistance states are considered logic low ("0") and high-resistance states are considered logic high ("1"), FIG. 13A illustrates writing "100" to unipolar elements 206-0, 206-1, and 206-2.

Figure 13B:
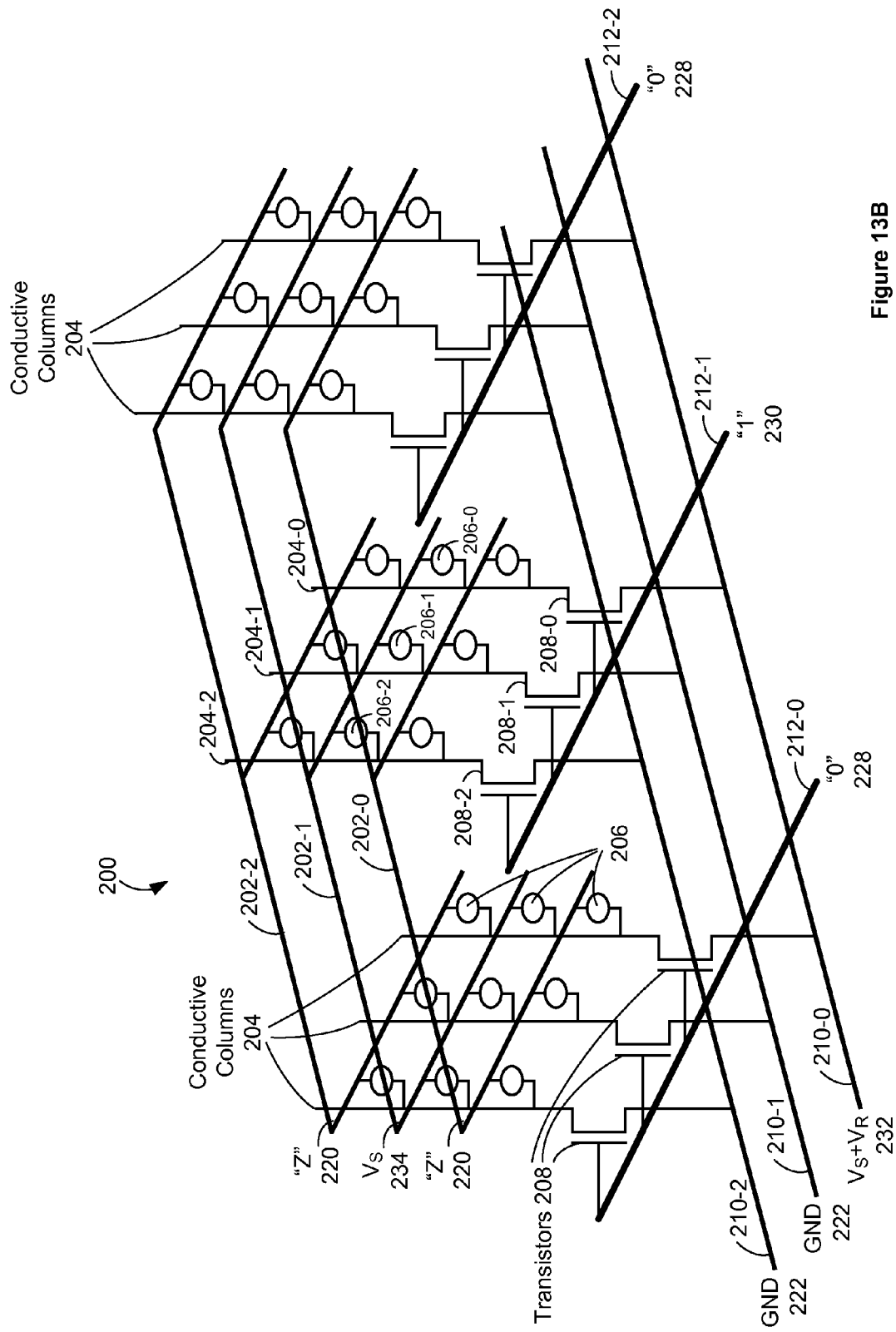
FIG. 13B illustrates SET and RESET operations for bipolar programmable memory elements in a memory architecture with horizontal conductive planes and vertical conductive columns in accordance with some embodiments.

FIG. 13B illustrates SET and RESET operations for bipolar programmable memory elements 206 in the memory architecture 200 in accordance with some embodiments. Specifically, FIG. 13B illustrates simultaneous SET operations for programmable memory elements 206-1 and 206-2 and a RESET operation for the programmable memory element 206-0. The conductive plane 202-1 is selected by applying a SET voltage $V_S$ 234 to the plane 202-1 while other conductive planes 202-0 and 202-2 are tristated ("Z" 220) and thus deselected. Vertical conductive columns 204-0, 204-1, and 204-2 are selected as discussed with regard to FIG. 13A. The bit lines 210-1 and 210-2 are grounded (GND 222), resulting in application of the SET voltage $V_S$ 234 to the elements 206-1 and 206-2. The elements 206-1 and 206-2 thus are programmed to low-resistance states. Simultaneously, a voltage $V_S+V_R$ 232 is applied to the bit line 210-0, resulting in application of the RESET voltage $-V_R$ to the element 206-0. The element 206-0 thus is programmed to a high-resistance state. If low-resistance states are considered logic low ("0") and high-resistance states are considered logic high ("1"), FIG. 13B illustrates writing "100" to unipolar elements 206-0, 206-1, and 206-2.

If a programmable memory element includes an isolation device with bidirectional conductivity above a threshold voltage $V_{TH}$, arranged in series with resistance-switching material, then the voltage to be applied to the programmable memory element is the sum of $V_{TH}$ and the voltage that would be applied in the absence of the isolation device. For a unipolar cell with such an isolation device, a high-resistance state is created if the voltage of a pulse applied to the cell is greater than or equal to $V_R+V_{TH}$ and less than $V_S+V_{TH}$, and a low-resistance state is created if the voltage of the pulse applied to the cell is greater than or equal to $V_S+V_{TH}$. For a bipolar cell with such an isolation device, a high-resistance state is created if a voltage of a pulse applied to the cell has a first polarity and a magnitude greater than or equal to a $V_R+V_{TH}$, and a low-resistance state is created if a voltage of a pulse applied to the cell has a second polarity opposite to the first polarity and a magnitude greater than or equal to a $V_S+V_{TH}$.

Figure 14A:
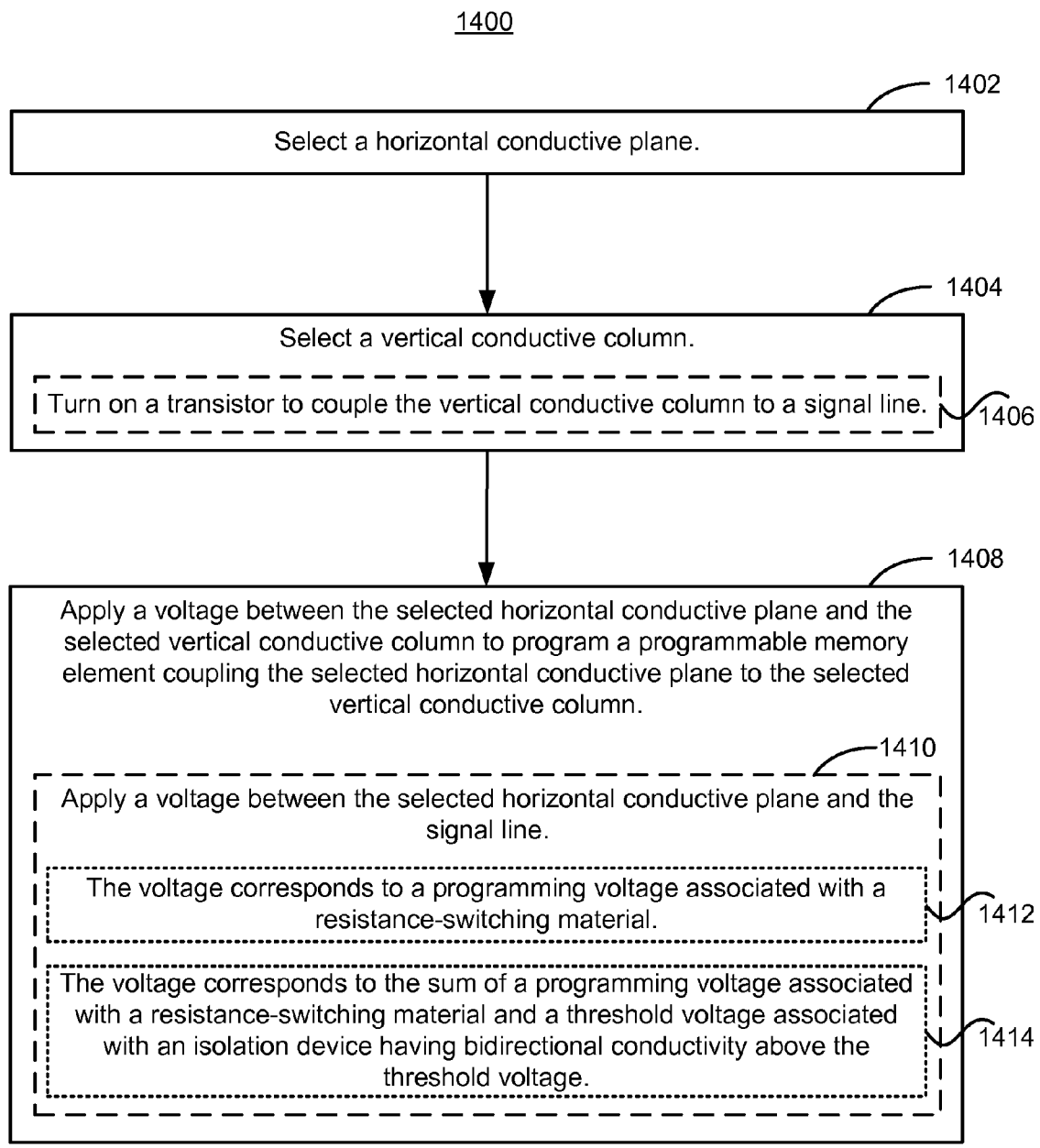
FIG. 14A is a flow diagram illustrating a method of writing to programmable memory elements in accordance with some embodiments.

FIG. 14A is a flow diagram illustrating a method 1400 of writing to programmable memory elements in accordance with some embodiments. The method 1400 is performed in a memory device that includes a plurality of insulated horizontal conductive planes (e.g., planes 202, FIGS. 2 and 13A-13B), an array of vertical conductive columns (e.g., columns 204, FIGS. 2 and 13A-13B) that pass through apertures in the plurality of horizontal conductive planes, and a plurality of programmable memory elements (e.g., elements 206, FIGS. 2 and 13A-13B) coupling the horizontal conductive planes to the vertical conductive columns.

In the method 1400, a horizontal conductive plane (e.g., plane 202-1, FIG. 13A or 13B) is selected (1402).

A vertical conductive column (e.g., any of columns 204-0, 204-1, and 204-2, FIG. 13A or 13B) is selected (1404). In some embodiments, a transistor (e.g., any of transistors 208-0, 208-1, and 208-2, FIG. 13A or 13B) is turned on (1406) to couple the vertical conductive column to a signal line (e.g., any of bit lines 210-0, 210-1, and 210-2, FIG. 13A or 13B).

A voltage is applied (1408) between the selected horizontal conductive plane and the selected vertical conductive column to program a programmable memory element (e.g., any of elements 206-0, 206-1, and 206-2, FIG. 13A or 13B) coupling the selected horizontal conductive plane to the selected vertical conductive column. In some embodiments, a voltage is applied (1410) between the selected horizontal conductive plane and the signal line. This voltage corresponds (1412), for example, to a programming voltage (e.g., $V_R$ 1202 or $V_S$ 1204, FIG. 12A) (e.g., $-V_R$ 1212 or $V_S$ 1214, FIG. 12B) associated with a resistance-switching material. Alternatively, this voltage corresponds (1414) to the sum of a programming voltage associated with a resistance-switching material and a threshold voltage $V_{TH}$ associated with an isolation device having bidirectional conductivity above the threshold voltage.

The method 1400 thus enables write operations in memory architectures such as the architecture 200 (FIG. 2). While the method 1400 includes a number of operations that appear to occur in a specific order, it should be apparent that the method 1400 can include more or fewer operations, which can be executed serially or in parallel, an order of two or more operations may be changed, and/or two or more operations may be combined into a single operation.

Read operations for RRAM programmable memory elements (i.e., RRAM cells) in the memory architecture 200 (FIG. 2) are similar to write operations, except that the voltage applied to the programmable memory element to perform the read operation is held below $V_R$. If the programmable memory elements include isolation devices with bidirectional conductivity above a threshold voltage $V_{TH}$, the voltage applied for read operations is greater than $V_{TH}$ but less than $V_R+V_{TH}$.

Figure 14B:
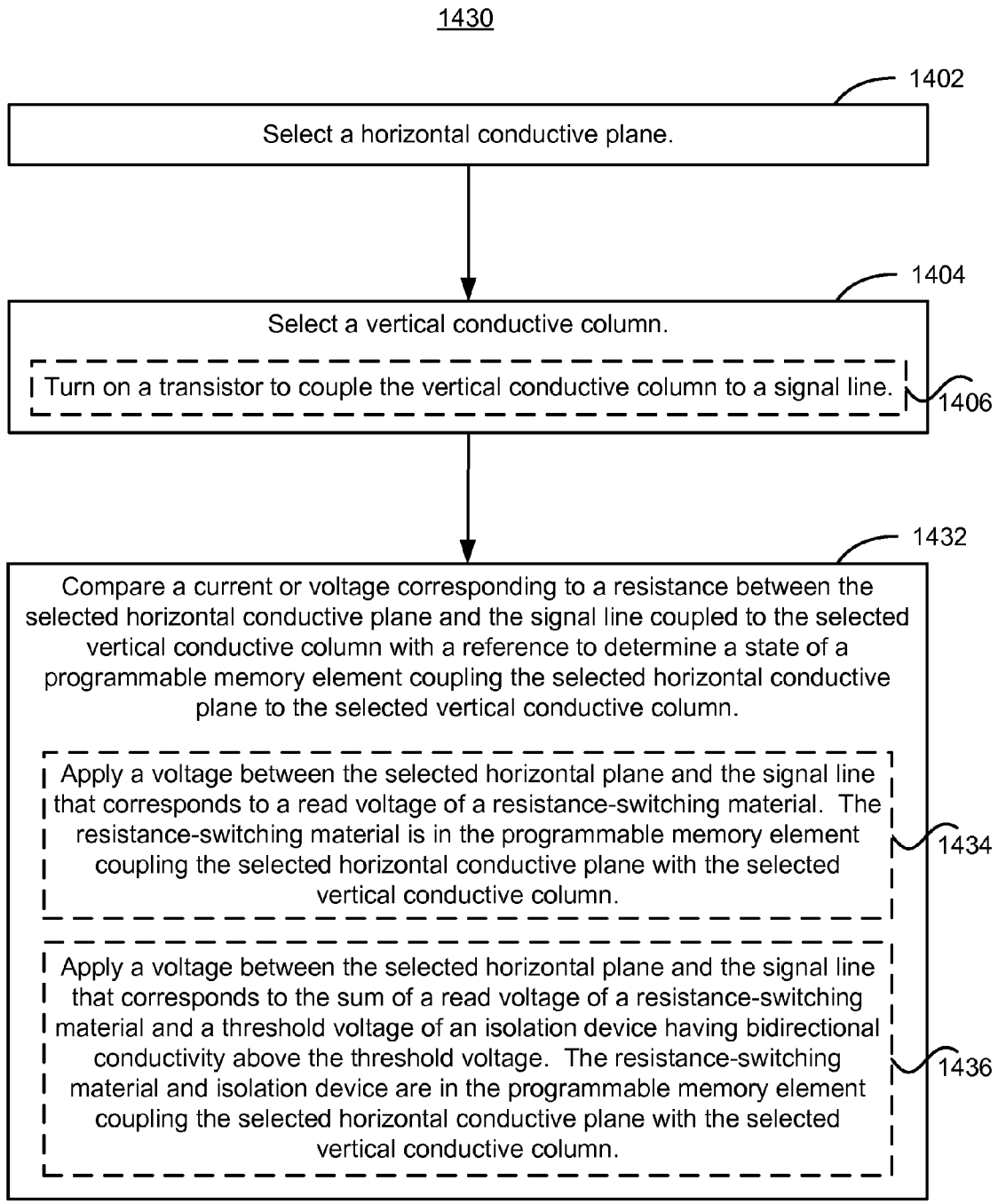
FIG. 14B is a flow diagram illustrating a method of reading programmable memory elements in accordance with some embodiments.

FIG. 14B is a flow diagram illustrating a method 1430 of reading programmable memory elements in accordance with some embodiments. The method 1430 is performed in a memory device that includes a plurality of insulated horizontal conductive planes (e.g., planes 202, FIGS. 2 and 13A-13B), an array of vertical conductive columns (e.g., columns 204, FIGS. 2 and 13A-13B) that pass through apertures in the plurality of horizontal conductive planes, and a plurality of programmable memory elements (e.g., elements 206, FIGS. 2 and 13A-13B) coupling the horizontal conductive planes to the vertical conductive columns.

In the method 1430, the selection operations 1402 and 1404 are performed as described in the method 1400 (FIG. 14A).

A current or voltage corresponding to a resistance between the selected horizontal conductive plane (e.g., plane 202-1, FIG. 13A or 13B) and the signal line (e.g., any of bit lines 210-0, 210-1, and 210-2, FIG. 13A or 13B) coupled to the selected vertical conductive column (e.g., any of columns 204-0, 204-1, and 204-2, FIG. 13A or 13B) is compared (1432) with a reference to determine a state of a programmable memory element (e.g., any of elements 206-0, 206-1, and 206-2, FIG. 13A or 13B) coupling the selected horizontal conductive plane to the selected vertical conductive column.

In some embodiments, the current to be compared with the reference is generated by applying (1434) a voltage between the selected horizontal plane and the signal line that corresponds to a read voltage of a resistance-switching material (e.g., material 420, FIGS. 5A-5D). The resistance-switching material is in the programmable memory element coupling the selected horizontal conductive plane with the selected vertical conductive column.

In some embodiments, the current to be compared with the reference is generated by applying (1436) a voltage between the selected horizontal plane and the signal line that corresponds to the sum of a read voltage of a resistance-switching material (e.g., material 808, FIG. 8) and a threshold voltage of an isolation device having bidirectional conductivity above the threshold voltage (e.g., the MIM structure 802-804-806, FIG. 8). The resistance-switching material and isolation device are in the programmable memory element coupling the selected horizontal conductive plane with the selected vertical conductive column.

Alternatively, the read operation includes using current developed by the voltage applied between the selected horizontal plane and the signal line to charge or discharge a capacitor within a fixed time.

The method 1430 thus enables read operations in memory architectures such as the architecture 200 (FIG. 2). While the method 1430 includes a number of operations that appear to occur in a specific order, it should be apparent that the method 1430 can include more or fewer operations, which can be executed serially or in parallel, an order of two or more operations may be changed, and/or two or more operations may be combined into a single operation.

Figure 15:
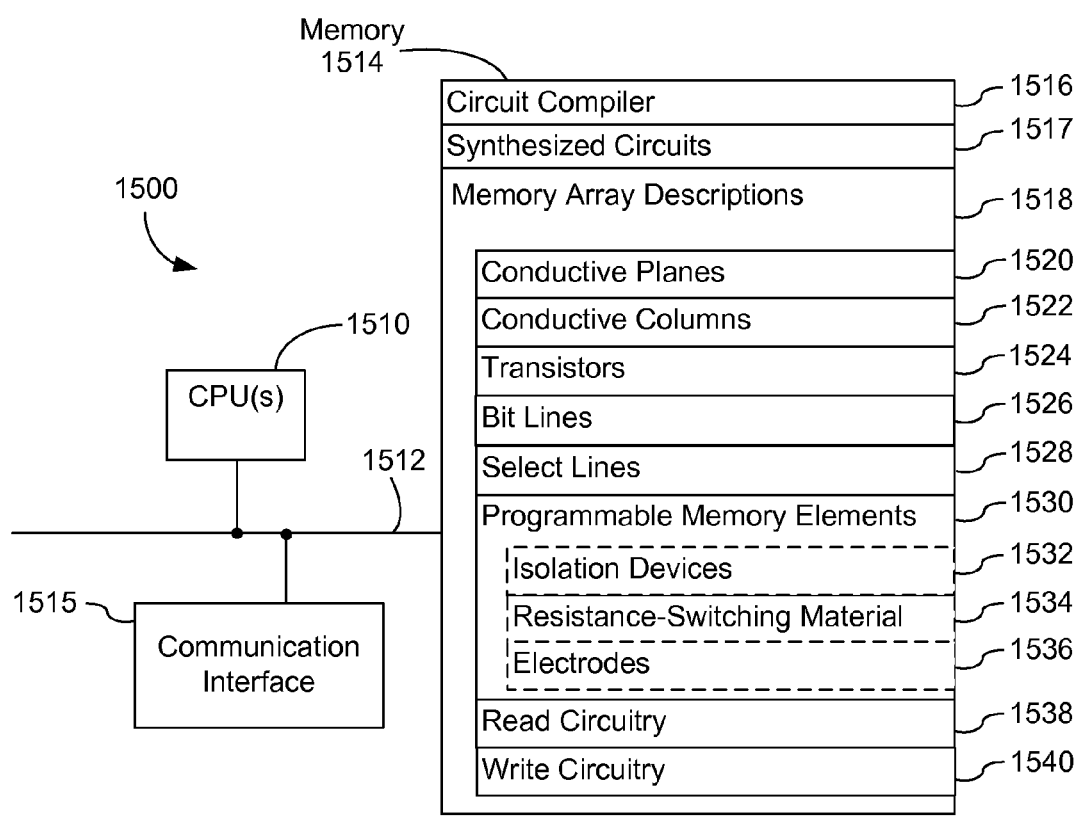
FIG. 15 is a block diagram of an embodiment of a system for storing computer readable files containing software descriptions of components for implementing a memory array in accordance with some embodiments.

FIG. 15 is a block diagram of an embodiment of a system 1500 for storing computer readable files containing software descriptions of components for implementing a memory array in accordance with some embodiments. The system 1500 may include one or more data processors or central processing units (CPU) 1510, memory 1514, (optionally) one or more communication interfaces 1515 for exchanging information with other computer systems or devices, and one or more signal lines or communication busses 1512 for coupling these components to one another. The communication buses 1512 may include circuitry (sometimes called a chipset) that interconnects and controls communications between system components. Memory 1514 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 1514 may optionally include one or more storage devices remotely located from the CPU(s) 1510. Memory 1514, or alternately the non-volatile memory device(s) within memory 1514, comprises a computer readable storage medium. In some embodiments, memory 1514 stores in one or more of the previously mentioned memory devices a circuit compiler 1516, memory array descriptions 1518, and receiver circuit descriptions 842. The circuit compiler 1516, when executed by a processor such as CPU(s) 1510, processes one or more memory array descriptions 1518 to synthesize one or more corresponding circuits 1517.

In some embodiments, the memory array descriptions 1518 include descriptions of conductive planes 1520, conductive columns 1522, transistors 1524, bit lines 1526, select lines 1528, programmable memory elements 1530, read circuitry 1538, and write circuitry 1540. In some embodiments, the descriptions of the programmable memory elements 1530 include descriptions of isolation devices 1532, resistance-switching material 1534, and electrodes 1536.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to practice various embodiments with various modifications as are suited to the particular use contemplated.

What is claimed is:

1. A memory device, comprising:
a planar substrate;
a plurality of horizontal conductive planes above the planar substrate;
a plurality of horizontal insulating layers interleaved with the plurality of horizontal conductive planes;
an array of vertical conductive columns, perpendicular to the plurality of horizontal conductive planes and insulating layers, that pass through apertures in the plurality of horizontal conductive planes and insulating layers; and
a plurality of programmable memory elements, including a distinct set of programmable memo elements coupled to each respective horizontal conductive plane of the plurality of horizontal conductive planes, each element coupling one of the horizontal conductive planes to a respective vertical conductive column.

2. A memory device, comprising:
a planar substrate;
a plurality of horizontal conductive planes above the planar substrate;
a plurality of horizontal insulating layers interleaved with the plurality of horizontal conductive planes;
an array of vertical conductive columns, perpendicular to the plurality of horizontal conductive planes and insulating layers, that pass through apertures in the plurality of horizontal conductive planes and insulating layers; and
a plurality of programmable memory elements, each element coupling one of the horizontal conductive planes to a respective vertical conductive column, wherein a respective programmable memory element comprises a resistance-switching material having a first resistance state and a second resistance state.

3. The memory device of claim 2, wherein the resistance-switching material comprises a solid-state electrolyte.

4. The memory device of claim 2, wherein:
the resistance-switching material comprises $SiO_2$; and
the vertical conductive columns comprise Cu.

5. The memory device of claim 2, wherein:
the resistance-switching material comprises GeSe; and
the vertical conductive columns comprise Ag.

6. The memory device of claim 2, wherein:
the resistance-switching material comprises GeSe; and
the vertical conductive columns comprise Cu.

7. The memory device of claim 2, wherein:
the resistance-switching material comprises GeS; and
the vertical conductive columns comprise Cu.

8. The memory device of claim 2, wherein:
the resistance-switching material comprises CuO; and
the vertical conductive columns comprise Cu.

9. The memory device of claim 2, wherein the resistance-switching material comprises an insulating material.

10. The memory device of claim 9, wherein the insulating material is selected from the group consisting of $TiO_2$, NiO, $SrZrO_3$, $SrTiO_3$, $ZrO_2$, MO, MgO, $WO_3$, and $HfO_2$.

11. The memory device of claim 2, wherein the respective programmable memory element further comprises an isolation device in series with the resistance-switching material.

12. The memory device of claim 11, wherein the isolation device has bidirectional conductivity above a threshold voltage and comprises a dielectric material coupling first and second conductors.

13. The memory device of claim 11, wherein the isolation device has unidirectional conductivity above a threshold voltage.

14. The memory device of claim 13, wherein the isolation device comprises a diode.

15. The memory device of claim 2, wherein the resistance-switching material of the respective programmable memory element is situated in a first portion of a respective aperture in a first one of the conductive planes.

16. The memory device of claim 15, wherein the respective programmable memory element further comprises an isolation device in series with the resistance-switching material, the isolation device having bidirectional conductivity above a threshold voltage and comprising a film of insulating material situated in a second portion of the respective aperture.

17. The memory device of claim 16, wherein the isolation device and the resistance-switching material share a common electrode in the respective aperture.

18. The memory device of claim 2, wherein the respective programmable memory element comprises a ring of the resistance-switching material situated in a respective aperture in a first one of the conductive planes and surrounding a respective vertical conductive column.

19. The memory device of claim 18, wherein the respective programmable memory element further comprises an isolation device in series with the resistance-switching material, the isolation device having bidirectional conductivity above a threshold voltage and comprising a ring of insulating material concentric with the ring of the resistance-switching material in the first one of the conductive planes.

20. The memory device of claim 19, wherein the first one of the conductive planes comprises Al and the ring of insulating material comprises $Al_2O_3$.

21. The memory device of claim 19, wherein the ring of insulating material and the ring of the resistance-switching material share a common electrode comprising a metallic ring between and concentric with the ring of insulating material and the ring of the resistance-switching material in the first one of the conductive planes.

22. The memory device of claim 21, wherein the common electrode comprises an inert metal.

23. The memory device of claim 1, wherein a respective conductive plane has a thickness of 50 nm or less.

24. The memory device of claim 23, wherein a respective insulating layer has a thickness of 50 nm or less.

25. The memory device of claim 1, wherein a respective conductive plane comprises a stack of metallic layers including a layer of inert metal.

26. The memory device of claim 25, wherein:
the programmable memory elements comprise a resistance-switching material having a first resistance state and a second resistance state; and
the inert metal in the stack of metallic layers provides electrical contact to the resistance-switching material.

27. The memory device of claim 1, wherein a respective conductive plane comprises a Ti—Pt—Ti stack.

28. The memory device of claim 27, wherein:
the programmable memory elements comprise a resistance-switching material having a first resistance state and a second resistance state; and
the Pt in the Ti—Pt—Ti stack provides electrical contact to the resistance-switching material.

29. The memory device of claim 1, wherein a respective conductive plane comprises doped polysilicon.

30. The memory device of claim 1, further comprising:
a plurality of transistors, coupled to respective vertical conductive columns in the array, to select respective vertical conductive columns.

31. The memory device of claim 30, wherein a respective transistor comprises a vertical transistor.

32. The memory device of claim 30, wherein a respective transistor is configured to selectively couple a respective vertical conductive column to a signal line in the planar substrate.

33. The memory device of claim 32, wherein the signal line is configured to be selectively coupled, through respective transistors, to a plurality of vertical conductive columns.

34. The memory device of claim 33, wherein the plurality of vertical conductive columns form a row in the array of vertical conductive columns.

* * * * *